United States Patent
Pan et al.

(10) Patent No.: US 11,703,522 B2
(45) Date of Patent: Jul. 18, 2023

(54) SYSTEMS AND METHODS FOR THERMALLY REGULATING SENSOR OPERATION

(71) Applicant: SZ DJI TECHNOLOGY CO., LTD., Shenzhen (CN)

(72) Inventors: Guoxiu Pan, Shenzhen (CN); Renli Shi, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 972 days.

(21) Appl. No.: 16/559,278

(22) Filed: Sep. 3, 2019

(65) Prior Publication Data

US 2019/0391176 A1 Dec. 26, 2019

Related U.S. Application Data

(63) Continuation of application No. 15/458,879, filed on Mar. 14, 2017, now Pat. No. 10,429,409, which is a (Continued)

(51) Int. Cl.
*G01K 13/00* (2021.01)
*G01P 21/00* (2006.01)
(Continued)

(52) U.S. Cl.
CPC ............. *G01P 21/00* (2013.01); *B64C 39/024* (2013.01); *B81B 7/0087* (2013.01); (Continued)

(58) Field of Classification Search
CPC ............... G01P 21/00; B64C 2201/027; B64C 2201/108; B64C 2201/0235;
(Continued)

(56) References Cited

U.S. PATENT DOCUMENTS 5,527,003 A   6/1996 Diesel et al.
6,480,152 B2  11/2002 Lin et al.
(Continued)

FOREIGN PATENT DOCUMENTS

CN   1304379 A   7/2001
CN   1391147 A   1/2003
(Continued)

OTHER PUBLICATIONS

Dunzhu Xia, et al., ZRO Temperature Dependency Compensating-Control Design of Micro-Gyro, Journal of Southeast University (Natural Science Edition), Mar. 2012, pp. 290-294, vol. 42, No. 2.
(Continued)

*Primary Examiner* — Jeffrey P Aiello
(74) *Attorney, Agent, or Firm* — Anova Law Group, PLLC

(57) ABSTRACT

A thermal regulation system includes a sensor, one or more temperature adjusting devices, and a filler provided in a space between the sensor and at least one of the one or more temperature adjusting devices. The one or more temperature adjusting devices are (1) in thermal communication with the sensor, and (2) configured to adjust a temperature of the sensor from an initial temperature to a predetermined temperature at a rate of temperature change that meets or exceeds a threshold value.

18 Claims, 9 Drawing Sheets

Related U.S. Application Data continuation of application No. PCT/CN2015/076996, filed on Apr. 20, 2015.

(51) Int. Cl.

| | | |
|---|---|---|
| *G01C 25/00* | (2006.01) | |
| *G05D 1/00* | (2006.01) | |
| *B64C 39/02* | (2023.01) | |
| *B81B 7/00* | (2006.01) | |
| *B81C 99/00* | (2010.01) | |
| *G01D 3/036* | (2006.01) | |
| *G01D 18/00* | (2006.01) | |
| *G05D 23/19* | (2006.01) | |
| *B64U 10/13* | (2023.01) | |
| *B64U 30/20* | (2023.01) | |
| *B64U 101/60* | (2023.01) | |
| *B64D 43/00* | (2006.01) | |

(52) U.S. Cl.
CPC .......... *B81C 99/003* (2013.01); *G01C 25/005* (2013.01); *G01D 3/036* (2013.01); *G01D 18/008* (2013.01); *G01K 13/00* (2013.01); *G05D 1/0011* (2013.01); *G05D 23/19* (2013.01); *B64D 43/00* (2013.01); *B64U 10/13* (2023.01); *B64U 30/20* (2023.01); *B64U 2101/60* (2023.01); *B64U 2201/20* (2023.01); *B81B 2201/0242* (2013.01)

(58) Field of Classification Search
CPC .......... B64C 2201/0242; B81B 7/0087; G01D 18/008; G01D 3/036; G01K 13/00; G01K 7/01; G01K 7/42; G01K 7/22; G01K 15/00; G01K 3/14; G05D 1/0011; G05D 23/19; G06F 1/206; G06F 1/26; G06F 1/20; G06F 17/10; G01C 21/16; G01C 21/165
USPC .......... 73/204.19; 327/512–513; 374/1, 100, 374/107, 110, 121, 137, 141–143, 166, 374/183; 700/275, 299, 300; 702/47, 60, 702/85, 99, 104, 107, 116, 127, 130, 132, 702/136, 141, 182, 189
See application file for complete search history.

(56) References Cited

U.S. PATENT DOCUMENTS

| | | | |
|---|---|---|---|
| 6,486,661 B2 | 11/2002 | Chia et al. | |
| 6,515,285 B1 | 2/2003 | Marshall et al. | |
| 8,402,824 B1 | 3/2013 | Kubena | |
| 8,887,566 B1 | 11/2014 | Tanenhaus | |
| 2010/0315179 A1 | 12/2010 | Schoepf | |
| 2011/0127365 A1 | 6/2011 | Chappell | |
| 2011/0178707 A1* | 7/2011 | Sachs | G01C 17/38 |
| | | | 701/472 |
| 2012/0203488 A1 | 8/2012 | Dusha | |
| 2014/0191342 A1 | 7/2014 | Ohsaka et al. | |
| 2014/0208823 A1 | 7/2014 | Trusov | |
| 2016/0313584 A1* | 10/2016 | Zhao | G02F 1/1303 |
| 2020/0327383 A1* | 10/2020 | Fryshman | H04N 5/2252 |

FOREIGN PATENT DOCUMENTS

| | | | | |
|---|---|---|---|---|
| CN | 1666096 A | 9/2005 | | |
| CN | 101109637 A | 1/2008 | | |
| CN | 101619975 A | 1/2010 | | |
| CN | 102620719 A | 8/2012 | | |
| CN | 102841616 A | 12/2012 | | |
| CN | 103063879 A | 4/2013 | | |
| CN | 103248364 A | 8/2013 | | |
| CN | 103472259 A | 12/2013 | | |
| CN | 103502423 A | 1/2014 | | |
| CN | 203690968 U | 7/2014 | | |
| CN | 103988576 A | 8/2014 | | |
| EP | 2860502 A1 * | 4/2015 | ............... | G01K 1/14 |
| JP | H10170220 A | 6/1998 | | |
| JP | H10212999 A | 8/1998 | | |
| JP | 2003021613 A | 1/2003 | | |
| JP | 2003121285 A | 4/2003 | | |
| JP | 2008028017 A | 2/2008 | | |
| JP | 2009053100 A | 3/2009 | | |
| JP | 2009063380 A | 3/2009 | | |
| JP | 2012198037 A | 10/2012 | | |
| JP | 2012248015 A | 12/2012 | | |
| JP | 2013120173 A * | 6/2013 | ........... | G01N 17/008 |
| KR | 101365098 B1 | 2/2014 | | |
| RU | 2199777 C2 | 2/2003 | | |

OTHER PUBLICATIONS

Huiliang Cao, et al., "Temperature compensation of monitoring circuit for silicon MEMS gyroscope", Optics and Precision Engineering, vol. 21, No. 12, Dec. 2013.

The World Intellectual Property Organization (WIPO) International Search Report and Written Opinion for PCT/CN2015/076996 dated Feb. 1, 2016.

Niu, X. et al. "Fast Thermal Calibration of Low-Grade Inertial Sensors and Inertial Measurement Units", published Sep. 12, 2013, Sensors 2013, 13, 12192-12217, doi:10.3390/s130912192.

* cited by examiner (A)

(B)

(C)

SYSTEMS AND METHODS FOR THERMALLY REGULATING SENSOR OPERATION

CROSS-REFERENCE TO RELATED APPLICATIONS

This application is a continuation of application Ser. No. 15/458,879, filed Mar. 14, 2017, which is a continuation of International Application No. PCT/CN2015/076996, filed Apr. 20, 2015, the entire contents of both of which are incorporated herein by reference.

BACKGROUND OF THE DISCLOSURE

Sensor measurements can be biased as a function of the sensor operating temperature. In some cases, a calibration can be conducted to determine a relationship between sensor bias and sensor operating temperature such that a sensor measurement can be made more accurate by compensating for a change in the operating temperature of the sensor. Over time the calibration can drift. A user may need to return the sensor to the manufacturer to recalibrate the sensor. In some cases, a range of temperatures for which the sensor is calibrated can be limited to a narrow range of temperatures.

SUMMARY OF THE DISCLOSURE

Systems and methods are provided for calibrating and regulating the temperature of a sensor. One or more temperature adjusting devices can be provided to regulate the temperature of the sensor. One or more of the temperature adjusting devices can be provided to perform a calibration to determine a relationship between sensor bias and sensor temperature. The one or more temperature adjusting devices can be built into the sensor.

An aspect of the present disclosure provides a thermal regulation system for maintaining stable operation of a sensor, the system comprising: a sensor; one or more temperature adjusting devices that are (1) in thermal communication with the sensor, (2) configured to (a) adjust a temperature of the sensor from an initial temperature to a predetermined temperature and (b) record a sensor bias at (i) the initial temperature (ii) the predetermined temperature and (iii) one or more intermediate temperatures between the initial temperature and the predetermined temperature prior to operation of the sensor and (3) configured to adjust a temperature of the sensor from a starting temperature to an operating temperature; and one or more processors in communication with the sensor and the one or more temperature adjusting devices, the one or more processors programmed to correct a sensor measurement from the sensor based on the recorded sensor bias at (1) one or more intermediate temperature between the starting temperature and the predetermined temperature and (2) the predetermined temperature.

Another aspect of the present disclosure provides a method of regulating a temperature of a sensor unit, the method comprising: calibrating the sensor by providing a thermal stimulus from one or more temperature adjusting devices (1) in thermal communication with the sensor and (2) configured to (a) adjust a temperature of the sensor from an initial temperature to a predetermined temperature and (b) record a sensor bias at (i) the initial temperature (ii) the predetermined temperature and (iii) one or more intermediate temperatures between the initial temperature and the predetermined temperature prior to operation of the sensor; sensing a temperature of the sensor with a temperature sensor; providing a thermal stimulus from one or more temperature adjusting devices (1) in thermal communication with the sensor and (2) configured to adjust the temperature of the sensor from a starting temperature to an operating temperature; and correcting a sensor measurement from the sensor based on the recorded sensor bias at (1) one or more intermediate temperature between the starting temperature and the predetermined temperature and (2) the predetermined temperature.

In some embodiments, the one or more temperature adjusting devices may adjust a temperature of the sensor from an initial temperature to a predetermined temperature at a predetermined rate of temperature change. the one or more temperature adjusting devices may adjust a temperature of the sensor from a starting temperature to an operating temperature at an operating rate of temperature change. In some instances, the one or more temperature adjusting devices and the sensor may be installed on a shared substrate or a shared chip. The sensor bias may be recorded at one or more intermediate integer temperature between the initial temperature and the predetermined temperature. In some instances, temperature values outside of the values at which the sensor bias may be recorded prior to operation of the sensor are corrected by interpolating between a first value and a second value at which the sensor bias was recorded prior to operation of the sensor. For instance, the interpolation may be a linear interpolation.

In some embodiments, at least one of the one or more temperature adjusting devices may be a heater. Alternatively, at least one of the one or more temperature adjusting devices may be a cooling device. In some embodiments, the sensor may be an inertial measurement unit (IMU). For instance, the IMU may include a microelectromechanical system (MEMS) sensor. Alternatively, the sensor may be a gyroscope. Optionally, the sensor may be an array of sensors. In some instances, the shared substrate may be a printed circuit board (PCB).

In some embodiments, a plurality of the temperature adjusting devices may be uniformly distributed around the sensor in a three-dimension or a two-dimension space. In some instances, a distance between the sensor and each of the one or more temperature adjusting devices may be less than or equal to about 10 mm. Optionally, a distance between the sensor and each of the one or more temperature adjusting devices may be less than or equal to about 10 mm. Optionally, a distance between the sensor and each of the one or more temperature adjusting devices may be less than or equal to about 1 mm. Optionally, a distance between the sensor and each of the one or more temperature adjusting devices may be less than or equal to about 0.1 mm. In some instances, the predetermined rate of temperature change is about 1° C./s, about 0.1° C./s, about 0.01° C./s, or about 0.001° C./s.

In some embodiments, a filler may be provided in a space between the sensor and at least one of the one or more temperature adjusting devices. In some instances, the filler has a thermal conductivity that is at least about 2×, 5×, 10× or 100× the thermal conductivity of air. In some embodiments, the filler may be a thermal plastic, silicon or an epoxy, and may isolate the sensor from debris.

In some embodiments, a user may initiate a calibration by instructing the thermal regulation system to record the sensor bias at (i) the initial temperature (ii) the predetermined temperature and (iii) one or more intermediate temperatures between the initial temperature and the predetermined temperature prior to operation of the sensor. In some instances, the user may place the sensor on a horizontal surface during the calibration. In some instances, the calibration may be initiated by a user by entering a command on a user interface provided on the sensor. For instance, the user interface may comprise a button.

In some embodiments, the operating rate of temperature change may be equal to the predetermined rate of temperature change. Alternatively, the operating rate of temperature change may be greater than the predetermined rate of temperature change. For instance, the operating rate of temperature change may be at least about 2×, 10×, 50× or 100× the predetermined rate of temperature change. Optionally, the operating rate of temperature change may be less than the predetermined rate of temperature change. In some instances, the temperature adjusting devices may be turned off while the sensor is in use.

Another aspect of the present disclosure provides a thermal regulation system for maintaining stable operation of a sensor, the system comprising: a sensor; and one or more temperature adjusting devices that are (1) in thermal communication with the sensor, and (2) configured to adjust a temperature of the sensor from an initial temperature to a predetermined temperature at a rate of temperature change that meets or exceeds a threshold value, a filler provided in a space between the sensor and at least one of the one or more temperature adjusting devices.

In some embodiments, the sensor and the one or more temperature adjusting devices may be installed on a shared substrate or a shared chip. In some instance, In some embodiments, the sensor may be an inertial measurement unit (IMU). For instance, the IMU may include a microelectromechanical system (MEMS) sensor. Alternatively, the sensor may be a gyroscope. Optionally, the sensor may be an array of sensors. In some instances, the shared substrate may be a printed circuit board (PCB). In some embodiments, at least one of the one or more temperature adjusting devices may be a heater or a cooling device In some embodiments, a plurality of the temperature adjusting devices may be uniformly distributed around the sensor in a three-dimension or a two-dimension space. In some instances, a distance between the sensor and each of the one or more temperature adjusting devices may be less than or equal to about 10 mm. Optionally, a distance between the sensor and each of the one or more temperature adjusting devices may be less than or equal to about 10 mm. Optionally, a distance between the sensor and each of the one or more temperature adjusting devices may be less than or equal to about 1 mm. Optionally, a distance between the sensor and each of the one or more temperature adjusting devices may be less than or equal to about 0.1 mm. In some instances, the predetermined rate of temperature change is about 1° C./s, about 0.1° C./s, about 0.01° C./s, or about 0.001° C./s.

In some embodiments, a filler may be provided in a space between the sensor and at least one of the one or more temperature adjusting devices. In some instances, the filler has a thermal conductivity that is at least about 2×, 5×, 10× or 100× the thermal conductivity of air. In some embodiments, the filler may be a thermal plastic, silicon or an epoxy, and may isolate the sensor from debris.

In some embodiments, a bias error of the sensor during a transient state between the initial temperature and the predetermined temperature may be corrected based on a known temperature response of the bias error of the sensor. In some instances, the known temperature response of the bias error of the sensor may be determined by a user prior to using the sensor. The bias error of the sensor may compensated for based on the known temperature response of the bias error during (i) the transient state between the initial temperature and the predetermined temperature and (ii) a constant temperature state in which the sensor is at the predetermined temperature. In some embodiments, a bias error of the sensor may be corrected when the sensor is at the predetermined temperature based on a known temperature response of the bias error of the sensor at the predetermined temperature. The known temperature response of the bias error of the sensor at the predetermined temperature may be determined by a user prior to using the sensor. The bias error of the sensor may be compensated for based on the known temperature response of the bias error during a constant temperature state in which the sensor is at the predetermined temperature.

Another aspect of the present disclosure provides a method of regulating a temperature of a sensor, the method comprising: sensing an initial temperature of the sensor with a temperature sensor; providing a thermal stimulus from one or more temperature adjusting devices (1) in thermal communication with the sensor, and (2) configured to adjust a temperature of the sensor from the initial temperature to a predetermined temperature at a rate of temperature change that meets or exceeds a threshold value, and determining when the initial temperature of the sensor falls outside of a predetermined temperature range, wherein a filler is provided in a space between the sensor and at least one of the one or more temperature adjusting devices.

In some embodiments, a bias error of the sensor during a transient state between the initial temperature and the predetermined temperature may be corrected based on a known temperature response of the bias error of the sensor. The known temperature response of the bias error of the sensor may be determined by a user prior to using the sensor. In some embodiments, the bias error of the sensor may be compensated for based on the known temperature response of the bias error during (i) the transient state between the initial temperature and the predetermined temperature and (ii) a constant temperature state in which the sensor is at the predetermined temperature. In some embodiments a bias error of the sensor may be corrected when the sensor is at the predetermined temperature based on a known temperature response of the bias error of the sensor at the predetermined temperature. The known temperature response of the bias error of the sensor at the predetermined temperature may be determined by a user prior to using the sensor. In some the bias error of the sensor may be compensated for based on the known temperature response of the bias error during a constant temperature state in which the sensor is at the predetermined temperature embodiments.

Another aspect of the present disclosure provides a method of calibrating a temperature bias of a sensor, the method comprising: providing one or more temperature adjusting devices in thermal communication with the sensor; traversing through a series of predetermined discrete temperature values comprising a first predetermined discrete temperature value and a second predetermined temperature value, from the first predetermined discrete temperature value to the second predetermined temperature value; measuring a temperature bias of sensor at each predetermined discrete temperature value of the series of predetermined discrete temperature values; recording the temperature bias of the sensor at each corresponding predetermined discrete temperature value in a memory storage device; determining a relationship between the measured temperature bias of the sensor and each corresponding predetermined discrete temperature value; and adjusting a measurement provided by the sensor to reduce error based on the determined relationship between the measured temperature bias of the sensor and a known temperature of the sensor.

Another aspect of the present disclosure provides a thermal regulation system for generating a calibration of a sensor, the system comprising: one or more temperature adjusting devices in thermal communication with the sensor; a controller programmed to instruct the one or more temperature adjusting devices to adjust the temperature of the sensor through a series of predetermined discrete temperature values comprising a first predetermined discrete temperature value and a second predetermined temperature value, from the first predetermined discrete temperature value to the second predetermined temperature value; a thermal sensor for measuring a temperature bias of the sensor at each predetermined discrete temperature value of the series of predetermined discrete temperature values; a memory storage device that stores the temperature bias of the sensor at each predetermined discrete temperature value in a memory storage device; and one or more processors programmed to (1) determine a relationship between the measured temperature bias of the sensor and each predetermined discrete temperature value and store the determined relationship in the memory storage device and (2) adjust a measurement provided by the sensor to reduce error based on the determined relationship between the measured temperature bias of the sensor and a known temperature of the sensor.

In some embodiments, wherein traversing through a series of predetermined discrete temperature values from the first predetermined discrete temperature value to the second predetermined temperature value includes traversing through a series of predetermined discrete temperature values from the first predetermined discrete temperature value to the second predetermined temperature value with a predetermined rate of temperature change. In some embodiments, the relationship between the measured temperature bias of the sensor and each predetermined discrete temperature value may be described by a polynomial. In some embodiments, the one or more temperature adjusting devices may not operate while the sensor is in use.

In some embodiments, the series of predetermined discrete temperature values may be chosen by a user. In some embodiments, at least a fraction of the predetermined discrete temperature values in the series of predetermined discrete temperature values may be outside of a temperature of an ambient environment surrounding the sensor during calibration. In some embodiments, an instruction to determine the relationship may be provided by a user.

Another aspect of the present disclosure provides a method of manufacturing a self-regulating sensor unit on a sensor chip, the method comprising: attaching one or more temperature adjusting devices and the sensor unit on a shared sensor chip; and providing thermal communication between the one or more the one or more temperature adjusting devices and the sensor unit.

Another aspect of the present disclosure provides a self-regulating sensor unit on a sensor chip comprising: one or more temperature adjusting devices in thermal communication with the sensor unit; and one or more temperature sensors that sense a temperature of at least a portion of the sensor unit; and one or more processors configured to receive a temperature measurement from the one or more temperature sensors and transmit an operating instruction to the one or more temperature adjusting devices based on the temperature measurement.

In some embodiments, the one or more temperature adjusting devices may include at least one instrument that generates heat by internal resistance. For instance, the instrument may be a sensor.

Another aspect of the present disclosure provides a method of calibrating a temperature bias of a sensor by a user, the method comprising: providing one or more temperature adjusting devices in thermal communication with the sensor; receiving a command from the user to perform a calibration of the sensor; traversing, in response to the command from the user, through a series of predetermined discrete temperature values; measuring a temperature bias of sensor at each predetermined discrete temperature value of the series of predetermined discrete temperature values; recording the temperature bias of the sensor at each corresponding predetermined discrete temperature value in a memory storage device; determining a relationship between the measured temperature bias of the sensor and each corresponding predetermined discrete temperature value; and adjusting a measurement provided by the sensor to reduce error based on the determined relationship between the measured temperature bias of the sensor and a known temperature of the sensor.

Another aspect of the present disclosure provides a thermal regulation system for generating a calibration of a sensor by a user, the system comprising: one or more temperature adjusting devices in thermal communication with the sensor; a controller programmed to receive an instruction to instruct the one or more temperature adjusting devices to adjust the temperature of the sensor through a series of predetermined discrete temperature values, and measure a temperature bias of the sensor at each predetermined discrete temperature value of the series of predetermined discrete temperature values; a memory storage device that stores the temperature bias of the sensor at each predetermined discrete temperature value; and one or more processors programmed to (1) determine a relationship between the measured temperature bias of the sensor and each predetermined discrete temperature value and store the determined relationship in the memory storage device and (2) adjust a measurement provided by the sensor to reduce error based on the determined relationship between the measured temperature bias of the sensor and a known temperature of the sensor.

In another aspect of the present disclosure, a non-transitory computer readable medium comprising machine executable code that, upon execution by one or more computer processors, implements a method of calibrating a temperature bias of a sensor by a user, the method can comprise providing one or more temperature adjusting devices in thermal communication with the sensor; receiving at the one or more computer processors, a command from the user to perform a calibration of the sensor, wherein the user provides the command through a user interface in communication with the one or more computer processors; traversing, in response to the command from the user, through a series of predetermined discrete temperature values; measuring a temperature bias of the sensor at each predetermined discrete temperature value of the series of predetermined discrete temperature values; recording the temperature bias of the sensor at each corresponding predetermined discrete temperature value in a memory storage device that is in communication with the one or more computer processors; determining a relationship between the measured temperature bias of the sensor and each corresponding predetermined discrete temperature value; and transmitting a command from the one or more computer processors to adjust a measurement provided by the sensor to reduce error based on the determined relationship between the measured temperature bias of the sensor and a known temperature of the sensor.

In some embodiments, the sensor and the one or more temperature adjusting devices may be installed on a shared substrate or a shared chip. In some embodiments, the memory storage device may be in wireless communication with the sensor. In some embodiments, the relationship between the measured temperature bias of the sensor and each predetermined discrete temperature value may be described by a polynomial. In some embodiments, the one or more temperature adjusting devices may not operate while the sensor is in use.

Another aspect of the present disclosure provides a sensor chip comprising: a sensor unit; one or more temperature sensors that sense a temperature of at least a portion of the sensor unit; and one or more processors configured to receive a temperature measurement from the one or more temperature sensors.

In some embodiments, the sensor chip may further comprise one or more temperature adjusting devices in thermal communication with the sensor unit to adjust the temperature of the sensor unit through the series of predetermined discrete temperature values, according to an instruction from the one or more processors. Alternatively, the temperature of the sensor unit may be adjusted through the series of predetermined discrete temperature values by a heat emitted from one or more electronic components adjacent to the sensor chip. Optionally, the temperature of the sensor unit may be adjusted through the series of predetermined discrete temperature values by a heat generated by the sensor unit itself. For instance, the heat generated by the sensor unit itself may be generated by an internal resistance of the sensor unit.

In some embodiments, the one or more processors may be further configured to control a temperature of the sensor unit based on the temperature measurement. In some embodiments, the one or more processors may be further configured to determine a temperature bias of the sensor unit at (i) an initial temperature (ii) a predetermined temperature and (iii) one or more intermediate temperatures between the initial temperature and the predetermined temperature prior to operation of the sensor. In some embodiments, the one or more processors are further configured to correct a sensor measurement from the sensor unit from a starting temperature to an operating temperature based on the determined sensor bias at (1) one or more intermediate temperature between the starting temperature and the predetermined temperature and (2) the predetermined temperature.

In some embodiments, a plurality of the temperature adjusting devices may be uniformly distributed around the sensor unit in a three-dimension or two-dimension space. In some instances, a distance between the sensor unit and each of the one or more temperature adjusting devices may be less than or equal to about 10 mm. Optionally, a distance between the sensor unit and each of the one or more temperature adjusting devices is less than or equal to about 1 mm. In some embodiments, a filler may be provided in a space between the sensor unit and at least one of the one or more temperature adjusting devices.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present disclosure will be obtained by reference to the following detailed description that sets forth illustrative embodiments, in which the principles of the disclosure are utilized, and the accompanying drawings of which:

DETAILED DESCRIPTION OF THE EMBODIMENTS

Figure 1:
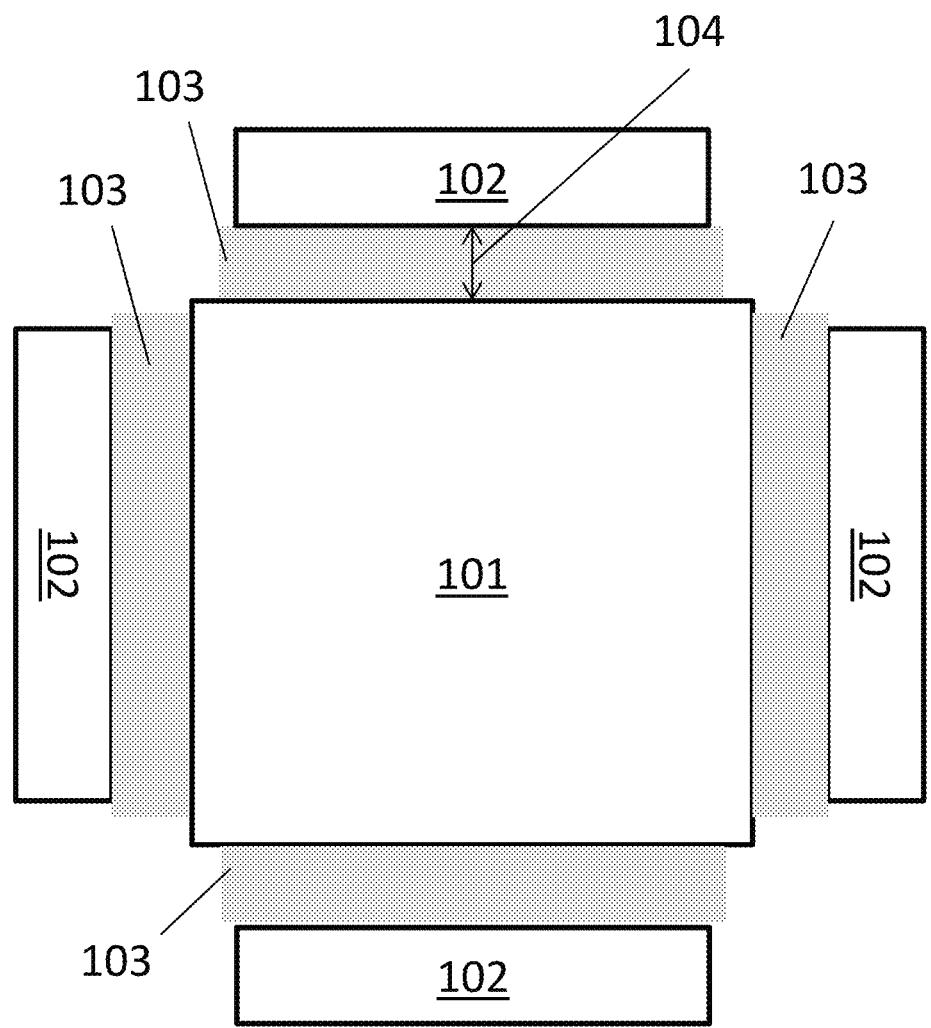
FIG. 1 shows a sensor with adjacent temperature adjustments devices and a filler provided between the sensor and the adjacent temperature adjustments devices.

While various embodiments of the disclosure have been shown and described herein, it will be obvious to those skilled in the art that such embodiments are provided by way of example only. Numerous variations, changes, and substitutions may occur to those skilled in the art without departing from the disclosure. It should be understood that various alternatives to the embodiments of the disclosure described herein may be employed.

Due to heating from internal resistance and/or fluctuations in an ambient temperature surrounding a sensor, a sensor can experience changes in operating temperature while a sensor is in use. Changes in a temperature of a sensor can impact a bias of one or more measurements of the sensor. In some cases, the temperature response of sensor bias can be dependent on a rate or change from a first temperature to a second temperature. A relationship that describes the sensor bias as a function of temperature can be determined prior to operation of the sensor. During operation of the sensor, the sensor bias can be corrected based on the predetermined relationship between the sensor bias and the sensor temperature.

A sensor can be on a movable object, such as an unmanned aerial vehicle (UAV). A sensor can be provided on the movable object for providing one or more measurements to one or more control systems on board the movable object. For instance, data from a sensor can be used during control of flight of the movable object. The data from the sensor can be used to control an attitude and/or position of a movable object. The data from the sensor may affect an angular position, angular velocity, angular acceleration, translational position, translational velocity, and/or translational acceleration of the movable object. A sensor can be provided on the movable object for providing measurements to one or more navigation systems on board the movable object. A sensor can be provided on the movable object for providing measurements to one or more surveillance systems on board the movable object. A sensor can be provided on the movable object for providing measurements to one or more flight systems on board the movable object.

In some cases, a movable object can move between different environments. A movable object can move from an indoor environment to an outdoor environment. A movable object can move from one altitude to a second altitude, the second altitude can be higher or lower relative to the first altitude. A sensor on a UAV can experience changes in environmental conditions, such as temperature, humidity, pressure, wind speed, noise, lighting, and/or altitude as the UAV is operated. In some cases, changes in environmental conditions surrounding the sensor on the UAV can result in changes in the sensor temperature. Changes in the sensor's temperature can result in bias in measurements collected by the sensor.

Bias in the sensor measurements can result in decreases in accuracy of one or more measurements obtained by the sensor. In some cases, a relationship between sensor bias and temperature can be determined. The relationship can be a linear relationship. The relationship can be represented by a polynomial. The relationship can be represented by a higher order polynomial. The relationship can have one or more linear regions over a range of temperatures.

Provided herein are systems and methods for determining a calibration that describes a relationship between a sensor operating temperature and a sensor measurement bias. The relationship can be used to provide a correction (e.g., compensation) to one or more sensor measurements collected at a known temperature. The known temperature can be a temperature measured by a temperature sensor that is provided in thermal communication with the sensor. In some cases, one or more temperature adjusting elements can be provided to perform a calibration to determine the relationship between the sensor bias and the temperature of the sensor. The one or more temperature adjusting elements can be built into the sensor. The one or more temperature adjusting elements can be built into the sensor when the sensor is manufactured. The one or more temperature adjusting elements can be built into a sensor unit as an after-market device.

In some cases, the one or more temperature adjusting devices and the sensor can be integrated on a substrate or may share a common substrate. The substrate can be formed from a semiconductor material. The substrate can be formed from silicon. The substrate can comprise a silicon wafer. In some cases, the one or more temperature adjusting devices and the sensor can be integrated on a substrate that includes electrical circuit connections. The one or more temperature adjusting devices and the sensor can be integrated onto a single chip. The chip can be a microchip. The sensor may be a chip. The sensor may be a chip that may be plugged into or out of the common substrate. The temperature adjusting device may or may not be a chip. The temperature adjusting device may or may not be a chip that may be plugged into or out of the common substrate. The sensor and temperature adjusting devices may be separate chips. Alternatively, the sensor and temperature adjusting devices may be integrated as a single chip. The single chip may or may not be able to be plugged into or out of a substrate (e.g., PCB).

The one or more temperature adjusting devices and the sensor may be in thermal communication with or without directly contacting one another. The one or more temperature adjusting devices and the sensor may be in thermal communication with or without sharing a substrate or other common support or connector. The one or more temperature adjusting devices and the sensor may or may not have one or more physical components that connect the one or more temperature adjusting devices to the sensor. In some instances, a gap may be provided between the one or more temperature adjusting devices and the sensor. The one or more temperature adjusting devices and the sensor may be physically separated from one another. The one or more temperature adjusting devices and the sensor may be different units or part of different units from one another. The one or more temperature adjusting devices and the sensor may be separable from one another. In some instances, the one or more temperature adjusting devices and the sensor may be in thermal communication primarily through radiation and/or convection. The one or more temperature adjusting devices and the sensor may be in thermal communication while utilizing little or no conduction. Heat transfer may occur more through radiation and/or convection than conduction. Alternatively, the one or more temperature adjusting devices and the sensor may be in thermal communication primarily through conduction.

The one or more heating elements can maintain the temperature of the sensor at a predetermined temperature. The one or more heating elements can provide a thermal stimulus to increase and/or decrease the temperature of the sensor at a predetermined rate of temperature change. The one or more heating elements can be used to perform a calibration on the sensor to determine the relationship between a sensor operating temperature and a sensor measurement bias for a given sensor in a given range of operating temperature. In some cases, the range of temperatures in which the sensor is calibrated can be provided by a user. In some cases, the user can calibrate the sensor prior to using the sensor. The user can repeat the sensor calibration at given time intervals, for example, daily, weekly, monthly, or yearly. The time intervals can be evenly or unevenly spaced. The user can perform the calibration without sending the sensor to a manufacturer.

A computer readable medium can include one or more processors programmed to execute machine readable code to perform the sensor calibration. A user can provide a command to the one or more processors through a graphical user interface that is in communication with the one or more processors. The graphical user interface can be provided on a display device. A display device can include a computer monitor, smart phone, or tablet. The graphical user interface can be provided on the sensor. The graphical user interface can be displayed on a screen. The graphical user interface can comprise one or more buttons.

During a calibration the sensor can be placed in a controlled environment. A controlled environment can be an environment in which an expected sensor reading is known. The environmental conditions, such as temperature, humidity, or other conditions, may or may not be known within a controlled environment. When the sensor is an inertial sensor, the sensor can be placed in an orientation with known x, y, and/or z coordinates during a calibration of the sensor. In an example, the sensor can be calibrated by a user by placing the sensor on a horizontal surface and providing a command to begin calibration. In another example, the sensor can be calibrated by a user by placing the sensor on a vertical surface and providing a command to begin calibration. A user can provide the command through a user interface such as a button, switch, or touch screen provided on or in contact with the sensor.

A sensor can be an image sensor. For example, an image sensor may be a monocular camera, stereo vision camera, radar, sonar, or an infrared camera. A sensor can be a sensor configured to determine a location of one or more objects, such as global positioning system (GPS) sensors, inertial sensors which may be used as part of or separately from an inertial measurement unit (IMU) (e.g., accelerometers, gyroscopes, magnetometers), lidar, ultrasonic sensors, acoustic sensors, WiFi sensors. Various examples of sensors may include, but are not limited to, location sensors (e.g., global positioning system (GPS) sensors, mobile device transmitters enabling location triangulation), vision sensors (e.g., imaging devices capable of detecting visible, infrared, or ultraviolet light, such as cameras), proximity or range sensors (e.g., ultrasonic sensors, lidar, time-of-flight or depth cameras), inertial sensors (e.g., accelerometers, gyroscopes, inertial measurement units (IMUs)), altitude sensors, attitude sensors (e.g., compasses) pressure sensors (e.g., barometers), audio sensors (e.g., microphones) or field sensors (e.g., magnetometers, electromagnetic sensors). The sensor can be a microelectromechanical system (MEMS) sensor.

Any suitable number and combination of sensors can be used, such as one, two, three, four, five, or more sensors. Any number of sensors may be provided on-board a movable object. Various sensors of different types (e.g., two, three, four, five, or more types) may be included in a sensor system or apparatus. Sensors of different types may measure different types of signals or information (e.g., position, orientation, velocity, acceleration, proximity, pressure, etc.) and/or utilize different types of measurement techniques to obtain data. For instance, the sensors may include any suitable combination of active sensors (e.g., sensors that generate and measure energy from their own energy source) and passive sensors (e.g., sensors that detect available energy). As another example, some sensors may generate absolute measurement data that is provided in terms of a global coordinate system (e.g., position data provided by a GPS sensor, attitude data provided by a compass or magnetometer), while other sensors may generate relative measurement data that is provided in terms of a local coordinate system (e.g., relative angular velocity provided by a gyroscope; relative translational acceleration provided by an accelerometer; relative attitude information provided by a vision sensor; relative distance information provided by an ultrasonic sensor, lidar, or time-of-flight camera). A single sensor may be able to collect a complete set of information in an environment or a group of sensors may work together to collect a complete set of information in an environment. Sensors may be used for flight control, mapping of a location, navigation between locations, detection of obstacles, or detection of a target. Sensors may be used for surveillance of an environment or a subject of interest. One or more of the sensors may be calibrated based on the sensor temperature. One or more of the sensors may be in thermal communication with one or more temperature adjusting devices. Zero, one, or more sensors on-board a movable object may be operated without regard to sensor temperature. Zero, one, or more sensors on-board the movable object may not be calibrated based on the sensor temperature.

The sensor may be part of an inertial measurement unit (IMU). The sensor can be part of a system configured to detect a change in an orientation of a movable object. The sensor can be part of a system configured to detect a change in position of a movable object. The sensor may detect an angular orientation, angular velocity, angular acceleration, translational position, translational velocity, and/or translational acceleration. The IMU may measure and report a movable object's velocity, orientation, and gravitational forces. The IMU may use a combination of accelerometers, gyroscopes, inclinometers, or magnetometers. The sensor can be part of a system comprising a plurality of sensors that provided different measurements for sensor fusion.

FIG. 1 shows a sensor 101 and a plurality of temperature adjusting devices 102 arranged adjacent to the sensor. The one or more temperature adjusting devices can be arranged relative to the sensor in a two-dimensional and/or three-dimensional configuration. The one or more temperature adjusting devices can be arranged relative to the sensor in a two-dimensional and/or three-dimensional pattern. One or more temperature adjusting devices can be parallel to a surface of the sensor. One or temperature adjusting devices can be perpendicular to a surface of the sensor. A central axis of one or more temperature adjusting devices can be coaxial with a central axis of the sensor. One or more temperature adjusting devices can be located in a plane containing the sensor. One or more temperature adjusting devices can be located in a plane that does not contain the sensor. One or more temperature adjusting devices may be located in a plane containing the sensor and parallel to a support or substrate upon which the sensor is attached. The one or more temperature adjusting devices may be located in a plane that does not contain the sensor and that is parallel to a support or substrate upon which the sensor is attached. At least one temperature adjusting device can be placed above sensor. At least one temperature adjusting device can be placed below sensor. At least one temperature adjusting device can be placed to the side of the sensor. One or more temperature adjusting devices can be placed along at least a portion of a perimeter of the sensor. One or more temperature adjusting devices can be next to the sensor.

In some cases, at least 1, 2, 3, 4, 5, 10, 15, 20, 30, 40, or 50 temperature adjusting devices can be provided adjacent to the sensor, or in thermal communication with the sensor. In some embodiments, fewer than 2, 3, 4, 5, 10, 15, 20, 30, 40, 50, 100, 200, or 500 temperature adjusting devices can be provided adjacent to the sensor, or in thermal communication with the sensor.

The temperature adjusting devices can be modular. One or more temperature adjusting devices can be removed and/or installed by a user. In some instances, a temperature adjusting device may be repeatedly removable and/or installable. A position of a temperature adjusting device may be altered by removing the temperature adjusting device from a first location and installing the temperature adjusting device at a second location different from the first location. A temperature adjusting device may be replaceable by removing a first temperature adjusting device from a location and installing a second temperature adjusting device at the location, wherein the second temperature adjusting device is different from the first temperature adjusting device.

One or more temperature adjusting devices can be arranged uniformly around the sensor. One or more temperature adjusting devices can be arranged non-uniformly around the sensor. One or more temperature adjusting devices can be arranged adjacent to a perimeter of the sensor. One or more temperature adjusting devices can be arranged symmetrically around the sensor. One or more temperature adjusting devices can be arranged asymmetrically around the sensor. Each temperature adjusting device can be adjacent to one or more sensors. A temperature adjusting device can be in thermal communication with the sensor. At least a portion of a temperature adjusting device can be in contact with the sensor.

The sensor can be a single sensor or an array of sensors. A description of a sensor may apply to one or more sensors. Any description herein of a sensor may apply to a plurality of sensors. The one or more sensors may be arranged in a row, a column, an array, in staggered rows or columns, radially, or in any other configuration. Any description herein of an array of sensors may apply to one or more sensors provided in any configuration. One or more, two or more, three or more, four or more, five or more, seven or more, ten or more, fifteen or more, twenty or more, thirty or more, forty or more, fifty or more, or 100 or more sensors may be provided. Any number of sensors may be in communication with a set of one or more temperature adjustment devices. The sensors may be in close proximity to one another. In some instances, one or more sensors may be distributed within an area of less than or equal to about 0.01 $cm^2$, 0.05 $cm^2$, 0.1 $cm^2$, 0.5 $cm^2$, 1 $cm^2$, 2 $cm^2$, 3 $cm^2$, 5 $cm^2$, 10 $cm^2$, 15 $cm^2$, 20 $cm^2$, 30 $cm^2$, 50 $cm^2$, or 100 $cm^2$. One or more sensors in the array of sensors can be different types of sensors. In some cases, two or more different types of sensors can be provided to collect different measurements that can be combined by sensor fusion to produce a measurement.

A temperature adjusting device can be a device configured to increase and/or decrease a temperature of the sensor. In some cases, a temperature adjusting device can be a heating element. A temperature adjusting device can be a cooling device. One or more of the temperature adjusting devices can be capable of heating the sensor. One or more of the temperature adjusting devices can be capable of cooling the sensor. One or more of the temperature adjusting devices can be capable of heating and cooling the sensor. A temperature adjusting device can be an active device (e.g., electric heater, fan, pumped fluid, or heat exchanger). A temperature adjusting device can be a passive device (e.g., cooling fin). In some cases, a temperature adjusting device can be powered by an electric power source. A temperature adjusting device can comprise a heat exchanger, a resistive heater, a combustor, a forced air heater, a thermoelectric element, a refrigerator, a cooling fin, a fan, or any other device configured to provide heating and/or cooling. In some cases, a temperature adjusting device can be an instrument with a purpose other than adjusting temperature.

A temperature adjusting device can be an instrument that generates heating and/or cooling as a result of operation of the instrument. In some cases, the instrument can be a sensor. The instrument can generate heat during operation. The instrument can generate heat during operation from internal resistance. The instrument may be the same type of sensor as the sensor in thermal communication with the temperature adjusting device. For example, the sensor may be an inertial sensor of an IMU, and instrument may be another inertial sensor of the IMU. The heat generated by the first inertial sensor may affect the temperature of the second inertial sensor, and vice versa. Alternatively, the instrument may be a different type of sensor as the sensor in thermal communication with the temperature adjusting device. Zero, one or more additional temperature adjusting devices may be provided, in addition to the instrument.

One or more temperature adjusting devices may individually or collectively cause the sensor to be actively heated and actively cooled. The one or more temperature adjusting devices may individually or collectively cause the sensor to be actively heated and passively cooled. The one or more temperature adjusting devices may individually or collectively cause the sensor to be passively heated and actively cooled. The one or more temperature adjusting devices may individually or collectively cause the sensor to be passively heated and passively cooled.

A temperature sensor may be provided and configured to measure the sensor's temperature. The temperature sensors can comprise a thermistor, a thermocouple, a thermometer, and/or a thermostat. The temperature sensor may measure the sensor's temperature in real-time. The temperature sensor may measure the sensor's temperature within less than about 0.01 seconds, 0.05 seconds, 0.1 seconds, 0.5 seconds, 1 second, 2 seconds, 3 seconds, 5 seconds, 10 seconds, 15 seconds, 20 seconds, 30 seconds, or 1 minute. The temperature sensor may measure the sensor's temperature within less than about a 0.01 degree accuracy, 0.05 degree accuracy, 0.1 degree accuracy, 0.25 degree accuracy, 0.5 degree accuracy, 1 degree accuracy, 2 degree accuracy, 3 degree accuracy, 5 degree accuracy, or 10 degree accuracy. The temperature sensor may be in thermal communication with the sensor. The temperature sensor may or may not be part of the sensor, or integrated into the sensor. The temperature sensor may or may not directly contact the sensor. The temperature sensor may or may not share a common substrate or connector with the sensor. A gap may or may not be provided between the temperature sensor and the corresponding sensor.

The temperature adjusting device can be in communication with a temperature sensor. The temperature sensor may or may not be in thermal communication with the temperature adjusting device. The temperature sensor may or may not communicate a temperature measurement to the temperature adjusting device. The temperature sensor may or may not communicate a command to the temperature adjusting device to vary (e.g., increase or decrease) or maintain the temperature of the sensor. The temperature sensor may or may not communicate with an intermediary device (e.g., one or more processors, controller), which may communicate with the temperature adjusting device. For instance, the temperature sensor may communicate a temperature measurement to the intermediary device, which may generate a command that is received by the temperature adjusting device to vary or maintain the temperature of the sensor. The temperature adjusting device can include a temperature sensor. Alternatively, the temperature adjusting device and the temperature sensor may be separate. The temperature adjusting device and the temperature sensor may or may not directly contact one another. The temperature adjusting device and the temperature sensor may or may not share a common substrate or connector. A gap may or may not be provided between the temperature adjusting device and the temperature sensor.

The temperature sensor can transmit a measured temperature of the sensor to a processor that can instruct the temperature adjusting device to adjust the temperature of the sensor when the temperature of the sensor falls outside of a predetermined range of operating temperature. In some cases, a predetermined operating temperature can be an optimal operating temperature of the sensor. The operating temperature can be about 0° C., 5° C., 10° C., 15° C., 20° C., 25° C., 30° C., 35° C., 40° C., 45° C., 50° C., 55° C., 60° C., 65° C., 70° C., 75° C., 80° C., 85° C., 90° C., 95° C., or 100° C. The operating temperature may be within less than or equal to about plus or minus 0.1 degrees, 0.5 degrees, 1 degree, 2 degrees, 3 degrees, 4 degrees, or 5 degrees of any of the temperature values listed herein. The operating temperature can be less than 0° C. The operating temperature can be greater than 100° C. The operating temperature can fall between any of the values listed.

The temperature adjusting devices can be in thermal communication with the sensor. For instance one or more of the temperature adjusting devices can be in thermal communication with an inertial sensor. One or more of the temperature adjusting devices may or may not directly contact the sensor. In some cases, the one or more temperature adjusting devices can be in thermal communication with the sensor by directly contacting at least a portion of the sensor. Alternatively or additionally at least one of the temperature adjusting devices may not be in direct contact with the sensor. At least one of the temperature adjusting devices can be in thermal communication with the sensor through a thermally conductive connector.

The temperature adjusting devices may optionally be part of the sensor. The temperature adjusting devices may be built into the sensor. The temperature adjusting devices and the sensor may be a single unit. The temperature adjusting devices and the sensor may be removed and/or installed on a substrate together as a unit. The temperature adjusting devices may be within, embedded within, or attached to a housing or structure of the sensor. The temperature adjusting devices may optionally be inseparable from the sensor without damaging the sensor or temperature adjusting device.

The temperature adjusting devices can be separated from a surface of the sensor such that a space 104 exists between the sensor and the temperature adjusting device. In some cases, a distance between a surface of the sensor and a heating element can be at least about 0.001 mm, 0.01 mm, 0.1 mm, 0.5 mm, 1 mm, 5 mm, 10 mm, 20 mm, 30 mm, 40 mm, 50 mm, 60 mm, 70 mm, 80 mm, 90 mm, or 100 mm. The distance between the sensor and the temperature adjusting device can be smaller than 0.001 mm or any of the other values listed above. The distance between the sensor and the temperature adjusting device can fall between any of the values listed above. In some cases a first distance between a first temperature adjusting device and a surface of the sensor and a second distance between a second temperature adjusting device and a surface of the sensor can be uniform. In some cases a first distance between a first temperature adjusting device and a surface of the sensor and a second distance between a second temperature adjusting device and a surface of the sensor can be non-uniform.

The temperature adjusting devices can facilitate a change of the sensor temperature (e.g., temperature increase and/or temperature decrease) by heat transfer to and/or away from the sensor. The temperature adjusting devices can actively facilitate a change of the sensor temperature. For example, the temperature adjusting device can transition from an off state to an on state, or vice versa, to force a specified temperature change in the sensor temperature. The temperature adjusting device may provide energy, the level of which may be adjustable. The temperature adjusting device may provide energy in a pulsed manner, the frequencies and/or durations of the pulses which may be adjustable. The temperature adjusting devices can passively facilitate a change of the sensor temperature. For example, the temperature adjusting device can provide a passive thermal stimulus to generate a change in the sensor temperature. A magnitude of the passive thermal stimulus may not be controllable. A passive temperature adjusting device can be a cooling fin. A passive temperature adjusting device can be a device that generates waste heat during routine operation, the waste heat can be transferred to the sensor. The temperature adjusting devices can facilitate heat transfer by conduction, convection, and/or radiation. The temperature adjusting devices can operate as heat sinks and/or heat sources.

In some cases a filler 103 can be provided between the one or more temperature adjusting devices and the one or more sensors. The filler can be provided in the space 104 between the sensor and one or more temperature adjusting devices. The filler can completely fill a gap between a temperature adjusting device and a surface of the sensor. The filler can partially fill a gap between a temperature adjusting device and a surface of the sensor. The filler can contact a temperature adjusting device and a surface of the sensor. The filler can provide a thermal contact between the temperature adjusting device and at least one surface of the sensor. The filler can facilitate transfer of heat between the sensor and the temperature adjusting device. The filler can increase a heat transfer rate to or from the temperature adjusting device to or from the sensor relative to a heat transfer rate without the filler provided in the space.

The filler can have properties that increase a heat transfer rate between the temperature adjusting device and the sensor. The filler can have a high thermal conductivity. The thermal conductivity of the filler can be at least about 2×, 5×, 10×, 20×, 30×, 40×, 50×, 60×, 70×, 80×, 90×, 100×, or 200× greater than the thermal conductivity of air as measured at standard temperature and pressure. In some cases, the filler can be a sealant, epoxy, silicone, or a non-silicone-type thermal plastic. The filler can isolate the sensor from an ambient environment. In some cases, the filler can prevent ambient dirt, dust, debris, and/or liquid from contacting the sensor. The filler can be provided along the entire surface of the sensor such that the sensor is completely isolated from an ambient environment. The sensor can be encapsulated by the filler. The temperature adjusting device may or may not be encapsulated by the filler. The temperature adjusting device may also be isolated from the ambient environment. The filler may encapsulate the one or more temperature adjusting devices and the sensor to form a unit.

Figure 2:
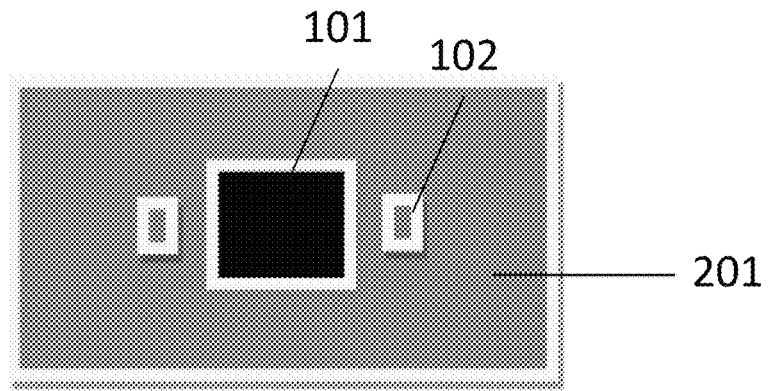
FIG. 2 shows arrangements of sensors and adjacent temperature adjustments devices on a shared substrate.
Figure 2:
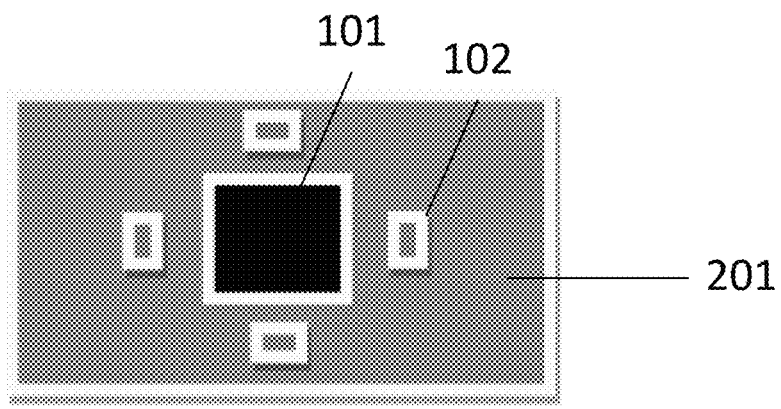
Figure 2:
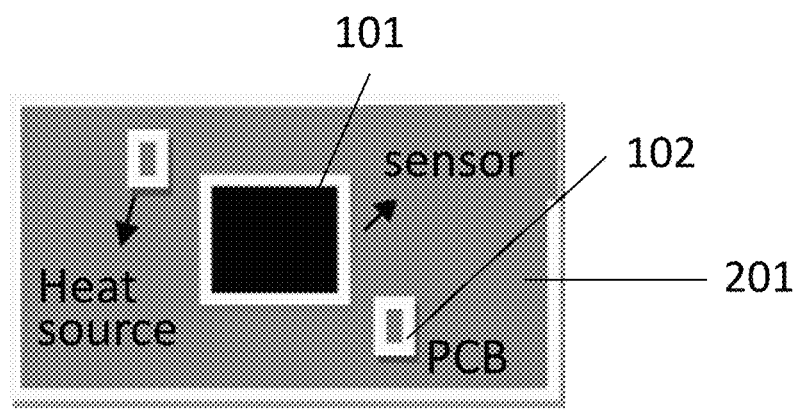

The sensor and the one or more temperature adjusting devices can be installed on a common substrate. FIG. 2 arrangement A shows a sensor 101 and a plurality of temperature adjusting devices 102 installed on a common (e.g., shared) substrate 201. The sensor and one or more temperature adjusting devices may directly contact the common substrate. The common substrate may bear the weight of the sensors and one or more temperature adjusting devices. The common substrate can be a semiconductor. The common substrate can be a printed circuit board (PCB). The common substrate can be a chip. The common substrate can be a microchip. The common substrate can be a surface comprising one or more embedded electrical contacts. The common substrate can be formed from a metallic (e.g., copper, iron, aluminum, or steel). The common substrate can be formed from a ceramic material (e.g., silicon or metal oxides). The common substrate can be formed from a composite material (e.g., carbon fiber). The common substrate can be formed from a plastic material. The common substrate can be a silicon wafer. The common substrate can be an electrically conductive substrate. The common substrate can be a thermally conductive substrate.

FIG. 2 arrangement B shows an arrangement of temperature adjusting devices uniformly arranged around a sensor on a shared substrate. In some embodiments, the temperature adjusting devices may be arranged around a sensor in a three dimensional configuration. In some embodiments the temperature adjusting devices may be arranged around the sensor in a two dimensional configuration. FIG. 2 arrangement C shows an arrangement of temperature adjusting devices non-uniformly arranged around a sensor on a shared substrate.

In some cases, the one or more temperature adjusting elements and the sensor can be built onto a shared substrate when the sensor is manufactured. The shared substrate can be a chip. The shared substrate can be a PCB. The shared substrate can be a microchip. In some cases, the one or more temperature adjusting elements and the sensor can be built onto a shared substrate as an after-market device.

The sensor may or may not be permanently affixed to the substrate. The sensor may or may not be removable from the substrate. The sensor may be repeatedly removable and installable on the substrate. The sensor may be plugged in and out of the substrate. The one or more temperature adjusting devices may or may not be permanently affixed to the substrate. The one or more temperature adjusting devices may or may not be removable from the substrate. The one or more temperature adjusting devices may be repeatedly removable and installable on the substrate. The one or more temperature adjusting devices may be plugged in and out of the substrate.

The sensors and/or temperature adjusting devices may or may not be in electrical communication with one or more electrical contacts of the substrate. The substrate may be a PCB with one or more electrical contacts thereon. The sensor may be electrically connected to the one or more electrical contacts. The sensor may or may not directly contact the one or more electrical contacts. Power to the sensor may or may not be provided via the one or more electrical contacts. The one or more temperature adjusting devices may be electrically connected to the one or more electrical contacts. The one or more temperature adjusting devices may or may not directly contact the one or more electrical contacts. Power to or from the temperature adjusting devices may or may not be provided via the one or more electrical contacts.

The shared substrate including the sensor and the one or more temperature adjusting devices can have a total volume of at most about 0.001 mm$^3$, 0.005 mm$^3$, 0.01 mm$^3$, 0.05 mm$^3$, 0.1 mm$^3$, 0.5 mm$^3$, 1 mm$^3$, 5 mm$^3$, 10 mm$^3$, 20 mm$^3$, 30 mm$^3$, 40 mm$^3$, 50 mm$^3$, 60 mm$^3$, 70 mm$^3$, 80 mm$^3$, 90 mm$^3$, 100 mm$^3$, 500 mm$^3$, or 1000 mm$^3$. The shared substrate can have a total volume less than 0.001 mm$^3$ or any other value listed herein. The shared substrate can have a total volume greater than 1000 mm$^3$ or any other value listed herein. The shared substrate can have a volume between any of the volumes listed.

The shared substrate comprising the sensor and one or more temperature adjusting devices can be integrated into a circuit board comprising other electrical circuits. The shared substrate can be arranged next to, on top of, and/or below one or more other shared substrates. The shared substrate can be arranged next to, on top of, and/or below one or more other sensors.

The one or more temperature adjusting devices can be configured to adjust a temperature of the sensor from an initial temperature to a predetermined temperature with a predetermined rate of temperature change. The predetermined rate of temperature change can be at least about 0.001° C./s, 0.005° C./s, 0.01° C./s, 0.05° C./s, 0.1° C./s, 0.5° C./s, 1° C./s, 2° C./s, 3° C./s, 5° C./s, 7° C./s, 10° C./s, 15° C./s, 20° C./s, 25° C./s, 30° C./s, 35° C./s, 40° C./s, 45° C./s, or 50° C./s. In some cases the rate of temperature change can fall between any of the values listed herein. The rate of temperature change can be constant over a given time period. The rate of temperature change can vary over a given time period. In some cases, the rate of temperature change can be constant for an entire operating time of the one or more temperature adjusting devices. The rate of temperature change can be a factory preset value. The rate of temperature change can be limited by the capacity of the one or more temperature adjusting devices. The rate of temperature change can be chosen by a user.

The initial temperature and/or the predetermined temperature can be chosen by a user, preset by a manufacturer at the time of fabrication of the sensor, and/or chosen by an individual other than the user. The initial temperature and/or predetermined temperature may be chosen with aid of one or more processors. In some instances, human intervention or input is not required for choosing the initial temperature and/or predetermined temperature. In some cases, the initial temperature and/or the predetermined temperature can be changed by a user or an individual other than the user. Optionally, the initial temperature and/or the predetermined temperature can be changed with aid of one or more processors. The initial temperature and/or the predetermined temperature can be changed while the sensor is in use. The initial temperature and/or the predetermined temperature can be chosen such that an expected operating temperature, or range of operating temperatures, of the sensor falls within a range bracketed by the initial temperature and the predetermined temperature. The initial temperature can be an ambient temperature in an environment surrounding the sensor. The initial temperature can be higher or lower than ambient temperature in an environment surrounding the sensor.

The initial temperature and the predetermined temperature can be separated by a wide range. In some cases, the initial and predetermined temperatures can range from about −100° C. to about 500° C. In some cases, the initial and predetermined temperatures can range from about −80° C. to about 300° C. In some cases, the initial and predetermined temperatures can range from about −60° C. to about 200° C. In some cases, the initial and predetermined temperatures can range from about −50° C. to about 150° C. In some cases, the initial and predetermined temperatures can range from about −45° C. to about 100° C. In some cases, the initial and predetermined temperatures can range from about −40° C. to about 125° C. The initial and predetermined temperatures can have a wider range than any of the ranges listed. The initial and predetermined temperatures can be shifted within any of the ranges listed or any other range of temperatures.

The temperature adjusting devices can be configured to record a sensor bias calibration for the sensor. The sensor bias calibration can be performed prior to operation of the sensor. The sensor bias calibration can be performed by a user of the sensor and/or by an individual that is not the user. The temperature adjusting devices can comprise an instrument configured to measure sensor bias of the sensor adjacent to the one or more temperature adjusting devices. The instrument configured to measure sensor bias of the sensor adjacent to the one or more temperature adjusting devices can be in communication with one or more processors configured to receive and analyze a measurement of sensor bias transmitted by the instrument of the temperature adjusting devices.

The sensor bias can be recorded in a memory storage device. The memory storage device can be installed on the shared substrate. The memory storage device can be off board the shared substrate. The memory storage device can be part of a server or cloud storage system.

The sensor bias can be recorded at the initial temperature. The sensor bias can be determined by one or more processors. The sensor bias can be determined based on an expected sensor measurement value compared to an actual sensor measurement value. During the calibration the sensor can be placed in an environment where an expected sensor measurement of the environment is known. In an example, when the sensor is an inertial measurement unit (IMU) or part of an IMU, the sensor can be placed on a horizontal surface while a calibration is performed. When the IMU is on a horizontal surface the IMU should read expected x and y values of 0 and an expected z value should be −g (e.g., gravity). Sensor bias can be determined by deviations from these expected values as a function of temperature. In another example, when the sensor is a gyroscope, the sensor can be placed on a horizontal surface while a calibration is performed. When the gyroscope is on a horizontal surface the gyroscope should read expected x, y, and z values of 0. Sensor bias can be determined by deviations from these expected values as a function of temperature.

The sensor bias can be recorded at the predetermined temperature. The sensor bias can be recorded at one or more intermediate temperatures between the initial temperature and the predetermined temperature. The sensor bias can be recorded at one, two or more discrete temperatures values between the initial temperature and the predetermined temperature. The discrete temperature values can be integer values. The discrete temperature values can be non-integer values. The discrete temperature values can be evenly or non-evenly spaced. The intermediate temperatures may be provided at less than or about every 0.01 degree, 0.05 degree, 0.1 degree, 0.25 degrees, 0.5 degrees, 0.75 degrees, 1 degree, 1.5 degrees, 2 degrees, 3 degrees, 5 degrees, 7 degrees, 10 degrees, 15 degrees, or 20 degrees C.

The sensor bias may be recorded at continuous temperatures between the initial temperature and the predetermined temperature. Thus, the bias may be continuously recorded for all values between the initial temperature and the predetermined temperature.

The sensor bias at the initial temperature, the predetermined temperature, and the one or more intermediate temperatures between the initial temperature and the predetermined temperature can be recorded before the sensor is implemented for operation. The sensor bias at the initial temperature, the predetermined temperature, and the one or more intermediate temperatures between the initial temperature and the predetermined temperature can be recorded and analyzed by the one or more processors to determine a relationship between the sensor bias and the sensor temperature.

The relationship between the sensor bias and sensor temperature can be a mathematically continuous relationship. The relationship between the sensor bias and sensor temperature can be a mathematically discontinuous relationship. The relationship between the sensor bias and sensor temperature can be a linear relationship. The relationship between the sensor bias and sensor temperature can be a non-linear relationship. The relationship between the sensor bias and sensor temperature can be a quadratic relationship.

The relationship between the sensor bias and sensor temperature can be a cubic relationship. The relationship between the sensor bias and sensor temperature can be represented by a polynomial. The polynomial may be of any degree (e.g., one, two, three, four, five, six, seven, eight, nine or more degrees). The relationship between the sensor bias and the sensor temperature can be an exponential relationship. The relationship between the sensor bias and the sensor temperature can be a logarithmic relationship. The relationship between the sensor bias and sensor temperature can be a proportional relationship. The relationship between the sensor bias the sensor temperature can be a direct relationship. The relationship between the sensor bias and sensor temperature can be an inverse relationship. In some embodiments, a mathematical relationship may be provided as an approximation of the actual relationship between the sensor bias the sensor temperature. A line of best fit may be created based on one or more data points. The line or relationship may or may not be able to intersect every data point.

Figure 3:
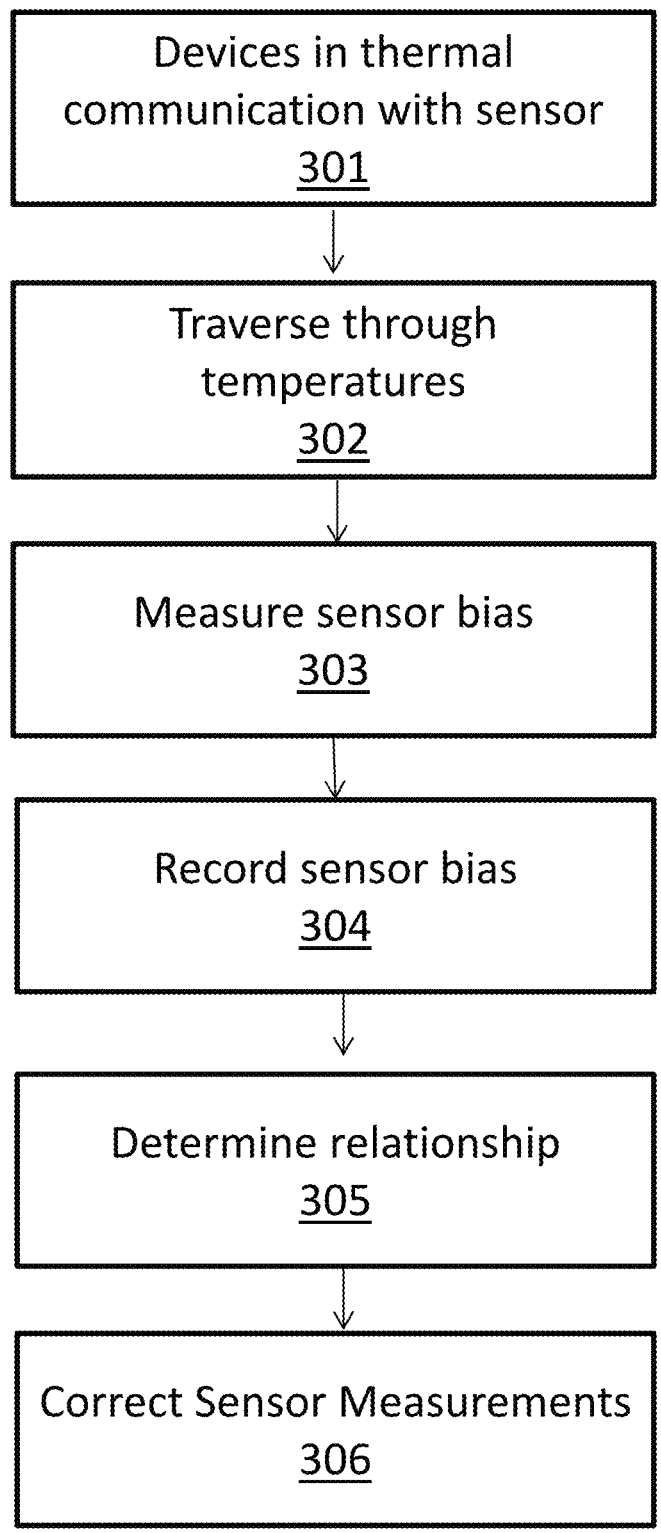
FIG. 3 shows a flow diagram of a calibration process.

FIG. 3 shows a flow diagram of a method that can be performed to generate a calibration of a temperature bias of a sensor. The method can be performed by a user. The user can be the end user of the sensor. In a first step 301, one or more temperature adjusting devices can be provided in thermal contact with the sensor. The one or more temperature adjusting devices may or may not directly contact the sensor. In a second step 302, the temperature of the sensor can be traversed through a series of predetermined discrete temperature values. The series of predetermined discrete temperature values can comprise a first predetermined discrete temperature value and a second predetermined temperature value. The temperature of the sensor can be traversed from the first predetermined discrete temperature value to the second predetermined temperature value. In a third step 303 temperature bias of the sensor can be measured at each predetermined discrete temperature value of the series of predetermined discrete temperature values. In a fourth step 304, the temperature bias of the sensor can be recorded at each corresponding predetermined discrete temperature value in a memory storage device. In a fifth step 305, a relationship between the measured temperature bias of the sensor and each corresponding predetermined discrete temperature value can be determined. In a sixth step 306, a measurement from the sensor can be adjusted to reduce error based on the determined relationship between the measured temperature bias of the sensor and a known temperature of the sensor. The steps provided herein can be performed in any order. One or more of the steps can be omitted. Additional steps can be added.

Figure 4:
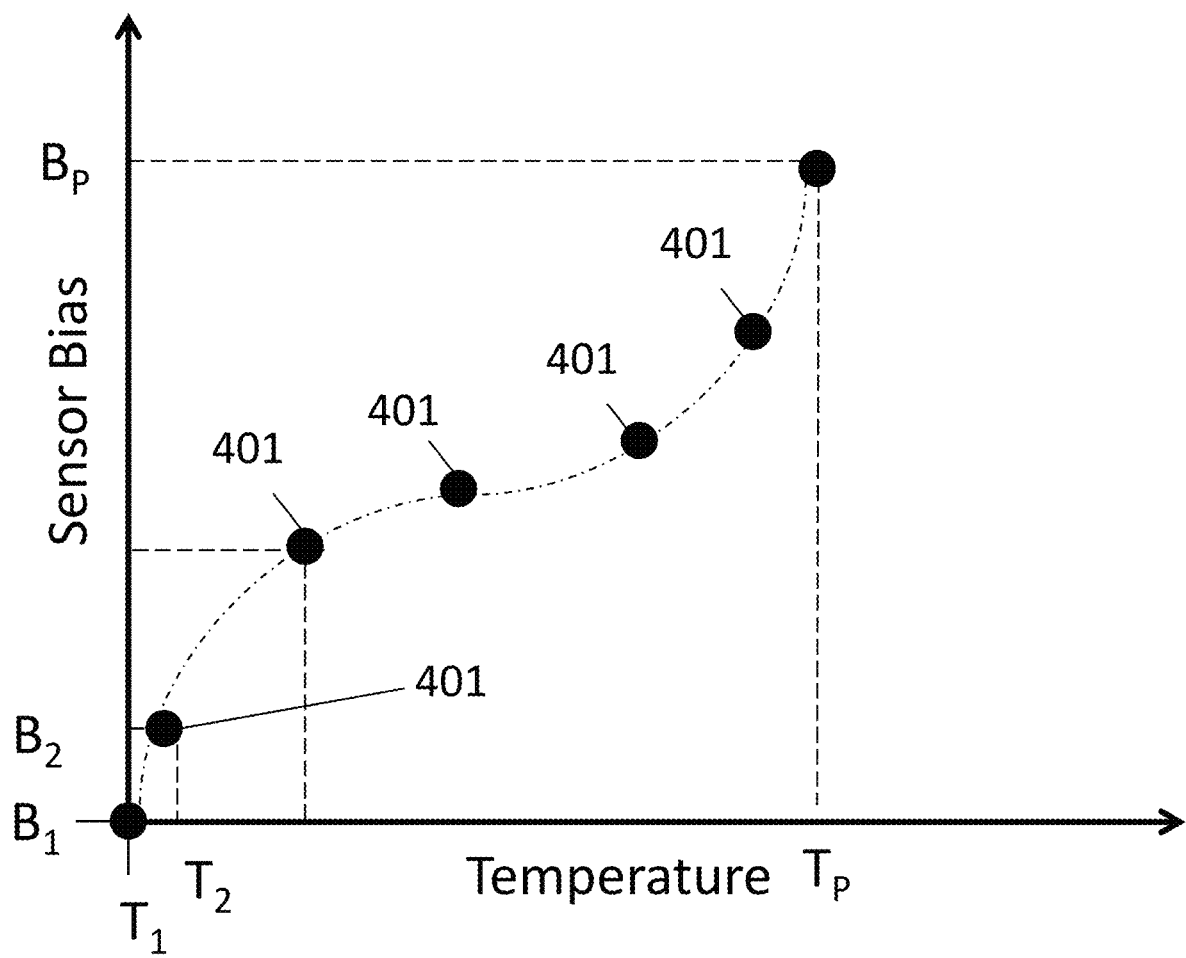
FIG. 4 shows a sensor bias as a function of temperature.

FIG. 4 shows a graphical representation of data that can be collected with the one or more temperature adjusting devices and analyzed to determine a relationship between the sensor bias and the sensor temperature during operation of the sensor. The one or more temperature devices can adjust the temperature of the sensor to an initial temperature T1. The temperature of the sensor can be measured by a temperature sensor (e.g., thermistor, thermocouple, or thermostat) in communication with either or both of the one or more temperature sensors and/or the one or more processors. Operation of the one or more temperature adjusting devices can be controlled in a feedback loop until the sensor is stabilized at the initial temperature. When the sensor is stabilized at the initial temperature T1, the sensor bias B1 at the initial temperature T1 can be measured and recorded. After recording the sensor bias the temperature devices can increment the temperature of the sensor to a second temperature T2 and similarly measure and record the second sensor bias B2 at the second temperature T2. The process of incrementing the sensor temperature and measuring and recording the sensor bias can be repeated until a final sensor bias measurement BP is recorded at the predetermined temperature TP.

The sensor bias can be measured and recorded at a plurality of intermediate points 401 between the initial temperature and the predetermined temperature. The sensor bias can be measured and recorded at a plurality of points in a series of predetermined discrete temperature values. The independent variable (e.g., temperature) for each intermediate point can be chosen at integer values of the independent variable. The values of the independent variable can be uniformly spaced. In some cases, the values of the independent variable can be non-uniformly spaced. A cluster of sensor bias measurements can be taken close to an expected operating temperature of the sensor such that the interval spacing of the values of the independent variable is smaller around the expected operating temperature of the sensor compared to the spacing of independent variable values far from the expected operating temperature of the sensor.

The time rate of change of the sensor temperature can be fixed or variable. The temperature adjusting devices can adjust the temperature of the sensor at a predetermined rate of change. In some cases, the rate of change can be the same during the sensor bias calibration and during operation of the sensor. Alternatively the rate of temperature change can be different during the bias calibration and during operation of the sensor.

The one or more temperature adjusting devices can adjust the temperature of the sensor while the sensor is operating. Alternatively, the one or more temperature adjusting devices may not be used while the sensor is operating. The one or more temperature adjusting devices can adjust the temperature of the sensor to a desired or predetermined operating temperature. The predetermined operating temperature can be chosen by a user. The predetermined operating temperature can be chosen with aid of one or more processors. User input may or may not be provided for operation of the one or more processors. The predetermined operating temperature can be chosen in order to minimize or reduce sensor bias. The predetermined operating temperature can be chosen to be a temperature at which sensor bias is known, or for which pre-calibration has occurred. The predetermined operating temperature can be chosen in order to minimize or reduce use of the temperature adjusting devices. The predetermined operating temperature can be chosen in a known linear or flat range of sensor bias as a function of temperature.

The predetermined operating temperature may be a target temperature for operation of the sensor. The target temperature may remain the same over time. The target temperature may be changed. The target temperature may be changed by the user or with aid of one or more processors. The target temperature may change in response to one or more detected events or environmental conditions. The target temperature may change in response to a power level of the movable object. The target temperature may remain the same during operation of a movable object that supports the sensor. The target temperature may remain the same while the movable object is in motion (e.g., is in flight). The target temperature may change during operation of the movable object. The target temperature may change while the movable object is in motion. The target temperature may change between different operation sessions of the movable object. The target temperature may change when the movable object is turned off and then turned on again.

The one or more temperature adjusting devices can be instructed to maintain the temperature of the sensor within a predetermined temperature operating range. The one or more temperature adjusting devices can maintain the sensor at an operating temperature in real time. The sensor can be maintained within at least about ±0.001%, ±0.005%, ±0.01%, ±0.05%, ±0.1%, ±0.5%, ±1%, ±5%, ±10%, or ±20% of a predetermined operating temperature. The sensor temperature can deviate from the predetermined temperature operating range. In some cases the sensor temperature can deviate from the predetermined temperature operating range as a result of waste heat from internal electrical resistance of the sensor, fluctuations in the ambient temperature in environment surrounding the sensor, and/or other events that cause heat transfer to or away from the sensor. A temperature sensor can continuously or discontinuously sense the temperature of the sensor while the sensor is operating.

When the temperature sensor detects that the sensor temperature has fallen outside of the predetermined temperature operating range, the one or more temperature adjustment devices can provided a thermal stimulus to adjust the temperature of the sensor from a starting temperature (e.g., the temperature that was detected outside of the predetermined temperature operating range) to an operating temperature within the predetermined temperature operating range. The thermal stimulus may heat or cool the sensor. The temperature adjusting devices can change the sensor temperature at an operating rate of temperature change that is equivalent to the rate of change at which the sensor was calibrated. In some cases, the temperature adjusting devices can change the sensor temperature at an operating rate of temperature change that is greater than the rate of change at which the sensor was calibrated. In some cases, the temperature adjusting devices can change the sensor temperature at an operating rate of temperature change that is less than the rate of change at which the sensor was calibrated.

One or more measurements taken by the sensor can be corrected for sensor bias as a function of temperature using the known relationship between sensor bias and temperature that was determined in the calibration discussed herein. One or more processors can perform the correction. The correction can include adjusting a sensor measurement by adding or subtracting a constant value. The correction can include adjusting the sensor measurement by multiplying the sensor measurement by a scaling factor. The scaling factor can be less than 1 or greater than 1. A correction can be made for temperatures outside of a range in which the calibration was performed using an interpolation technique. The interpolation can be performed by the one or more processors. The interpolation technique can be a linear interpolation technique. In some cases, the measurement can be corrected while the sensor is operating at a constant or near constant operating temperature. A near constant operating temperature can be a temperature that fluctuates at most about 0.1% from a mean temperature value over a given time period. A near constant operating temperature can be a temperature that fluctuates at most about 1% from a mean temperature value over a given time period. A near constant operating temperature can be a temperature that fluctuates at most about 5% from a mean temperature value over a given time period. A near constant operating temperature can be a temperature that fluctuates at most about 10% from a mean temperature value over a given time period. In some cases, the measurement can be corrected while the sensor temperature is transitioning from a starting temperature to an operating temperature.

In some embodiments, one or more temperature adjusting devices may adjust a temperature of a sensor. Alternatively, the temperature of the sensor is not actively adjusted and one corrections for sensor bias may or may not be made. In some embodiments, both active temperature adjustment of the sensor and corrections for sensor bias may occur.

In a first mode of operation, the measurement is only corrected while the sensor is operating at a constant or near constant operating temperature. In the first mode of operation the one or more temperature adjusting devices can facilitate a change in the temperature of the sensor from a starting temperature to an operating temperature at a rate faster than the predetermined rate of temperature change used during calibration of the sensor. In a second mode of operation, the measurement can be corrected while the sensor is operating at a constant or near constant operating temperature and while the sensor temperature is transitioning from a starting temperature to an operating temperature. In the second mode of operation the one or more temperature adjusting devices can facilitate a change in the temperature of the sensor from a starting temperature to an operating temperature at a rate that is about equal to the predetermined rate of temperature change used during calibration of the sensor. In some cases, the rate of temperature change from the starting temperature to an operating temperature is faster in the first mode compared to the second mode. In a third mode of operation the temperature adjusting devices may not operate while the sensor is operating. In the third mode of operation the temperature of the sensor can fluctuate as a result of thermal stimuli from an environment surrounding the sensor and/or from thermal stimuli from other instruments near the sensor. In the third mode of operation the temperature of the sensor from a starting temperature to an operating temperature can occur at a rate faster, slower, or about equal to the predetermined rate of temperature change used during calibration of the sensor.

Figure 5:
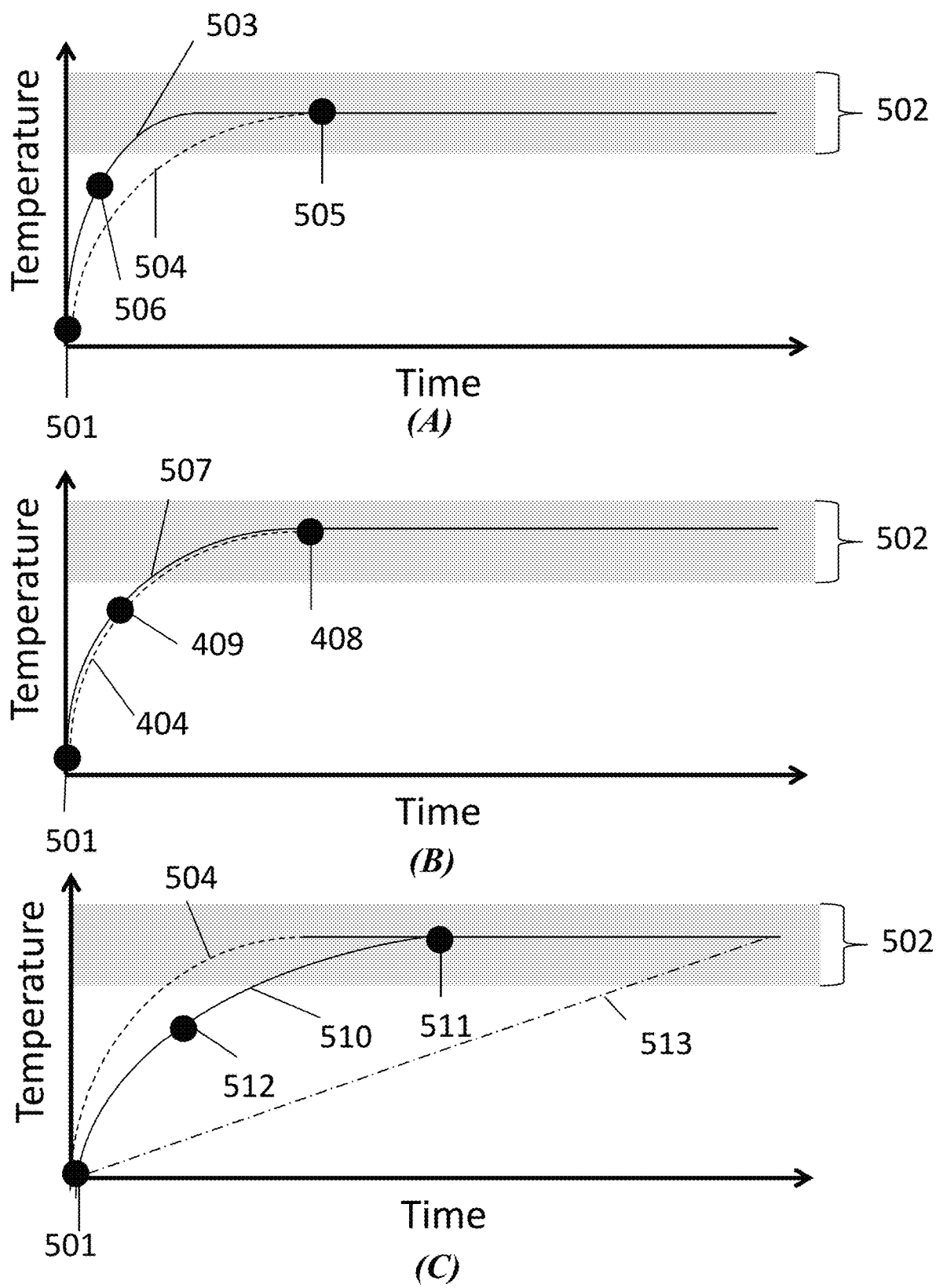
FIG. 5 shows time-temperature histories of a sensor device operating in a first mode, second mode, and third mode.

FIG. 5 scenario A shows a graphical time-temperature history corresponding to operation of the sensor in the first mode of operation. At a first instance in time 501 a temperature sensor can detect that the temperature of the sensor has fallen outside of the predetermined temperature operating range 502. In response to the detected temperature outside of the predetermined temperature operating range, one or more of the temperature adjusting devices can provide a thermal stimulus (e.g., heating or cooling) to cause a change in the temperature of the sensor to move the sensor temperature back into predetermined temperature operating range.

In the first mode of operation the one or more temperature adjusting devices can be configured to adjust the temperature of the sensor from an initial temperature to an operating temperature at a rate of temperature change above a threshold value. Line segment 503 is an example of a time-temperature history that can occur during a first mode of operation. The rate of temperature change during the first mode of operation can be linear, non-linear, logarithmic, or exponential. The rate of temperature change during the first mode of operation can be continuous or discontinuous.

Line segment 504 is an example of a time-temperature history of a temperature rate of change that the sensor can experience during calibration of the sensor. The rate of temperature change during the calibration can be linear, non-linear, logarithmic, or exponential. The rate of temperature change during the calibration can be continuous or discontinuous. The rate of temperature change during the calibration may or may not be approximated by the same relationship as the rate of temperature change during the first mode of operation.

The rate of temperature change during the first mode of operation can be the maximum rate of temperature change that can be achieved by the one or more temperature adjusting devices. The rate of temperature change achieved in the first mode of operation can be sufficiently fast such that not correcting a sensor measurement collected during the transition from the starting temperature to a temperature within the predetermined temperature operating range results in only a small error in the measurement. For example, the error in the measurement can be at most about ±0.001%, ±0.005%, ±0.01%, ±0.05%, ±0.1%, ±0.5%, ±1%, ±5%, or ±10%. The rate of temperature change achieved in the first mode can be at least about 2×, 5×, 10×, 20×, 30×, 40×, 50×, 60×, 70×, 80×, 90×, 100×, 150×, 200×, 250×, 300×, 350×, 400×, 450×, or 500× faster than the predetermined rate of temperature change used in a calibration prior to operation of the sensor.

In the first mode of operation a measurement from the sensor can be corrected for sensor bias as a function of temperature using the known relationship between sensor bias and temperature that was determined in the calibration. The calibration can be a higher order curve that describes a mathematical relationship between the sensor bias and the temperature of the sensor. In the first mode of operation, a correction can be made only while the sensor is operating within the predetermined temperature operating range, for example, at point 505. In the first mode of operation, a correction may not be made while the sensor is transitioning from a starting temperature to a temperature within the predetermined temperature operating range, for example, at point 506.

FIG. 5 scenario B shows a graphical time-temperature history corresponding to operation of the sensor in the second mode of operation. In the second mode of operation the one or more temperature adjusting devices can be configured to adjust the temperature of the sensor from a starting temperature to an operating temperature at a rate of temperature change that is nearly identical to the predetermined rate of temperature change used in a calibration prior to operation of the sensor. The rate of temperature change that is used in the second mode of operation can be at least within about ±0.001%, ±0.005%, ±0.01%, ±0.05%, ±0.1%, ±0.5%, ±1%, ±5%, or ±10% of the predetermined rate of temperature change used in the calibration prior to operation of the sensor.

Curve 507 can be a representative time-temperature history of a sensor operating in the second mode of operation. The rate of temperature change during the second mode of operation can be linear, non-linear, logarithmic, or exponential. The rate of temperature change during the second mode of operation can be continuous or discontinuous. The rate of temperature change during the second mode of operation and the rate of temperature change during calibration of the sensor can be approximated by the same type of mathematical operation.

Curve 504 can be representative of a time-temperature history of a temperature rate of change during the calibration of the sensor. In the second mode of operation the one or more temperature adjusting devices can be configured to adjust the temperature of the sensor from a starting temperature to an operating temperature at a rate of temperature change that is nearly identical to the predetermined rate of temperature change used in a calibration prior to operation of the sensor. In the second mode of operation curve 507 that can represent the time-temperature history of a sensor operating in the second mode of operation and curve 504 can substantially overlap.

In the second mode of operation a measurement from the sensor can be corrected for sensor bias as a function of temperature using the known relationship between sensor bias and temperature that was determined in the calibration. The calibration can be a higher order curve that describes a mathematical relationship between the sensor bias and the temperature of the sensor. In the second mode of operation, a correction can be made while the sensor is operating within the predetermined temperature operating range, for example, at point 508. In the second mode of operation, a correction can also be made while the sensor is transitioning from a starting temperature to a temperature within the predetermined temperature operating range, for example, at point 509.

In a third mode of operation, the one or more temperature adjusting devices can be configured to adjust the temperature of the sensor from an initial temperature to an operating temperature only for performing a calibration as described elsewhere herein. In the third mode of operation the temperature adjusting devices do not operate while the sensor is operating. In the third mode of operation the temperature adjusting devices do not actively adjust the temperature of the sensor while the sensor is operating. In the third mode of operation, a correction to a sensor measurement can also be made using the known relationship between sensor bias and temperature that was determined in the calibration. The relationship can be a higher order polynomial relationship. In some cases a correction can be made by a linear interpolation.

FIG. 5 scenario C shows a graphical time-temperature history corresponding to operation of the sensor in the third mode of operation. At a first instance in time 501 the temperature of the sensor can fall outside of the predetermined temperature operating range 502. Over time the sensor temperature can return to a temperature in the predetermined operating range. The sensor temperature can transition from a first temperature at the first instance in time 501 to a temperature in the predetermined temperature operating range 502 in response to a thermal stimulus provided in an environment surrounding the sensor. The sensor temperature can transition from a first temperature at the first instance in time 501 to a temperature in the predetermined temperature operating range 502 without operation of the one or more temperature adjusting devices. In some cases, the temperature of the sensor may not be within a temperature range that includes the predetermined operating temperature while the sensor is operating in the third mode of operation. The temperature of the sensor in the third mode of operation can be substantially constant.

Line segment 510 is an example of a time-temperature history that can occur during the third mode of operation. The rate of temperature change during the third mode of operation can be linear, non-linear, logarithmic, or exponential. The rate of temperature change during the third mode of operation can be continuous or discontinuous. The rate of temperature change during the third mode of operation can approach zero. In some cases, the rate of temperature change during the third mode of operation can be very slow, for example, the time-temperature history can be represented by line segment 513.

Line segment 504 is an example of a time-temperature history of a temperature rate of change that the sensor can experience during calibration of the sensor. The rate of temperature change during the calibration can be linear, non-linear, logarithmic, or exponential. The rate of temperature change during the calibration can be continuous or discontinuous. The rate of temperature change during the calibration may or may not be approximated by the same relationship as the rate of temperature change during the third mode of operation. In some cases, the rate of temperature change of the sensor during the third mode of operation can be less than, greater than, or equal to the rate of temperature change during the calibration. FIG. 5 scenario C shows an example of a rate of temperature change 510 during the third mode of operation that is slower (e.g., less) than the rate of temperature change that occurs during the calibration 504.

In the third mode of operation a measurement from the sensor can be corrected for sensor bias as a function of temperature using the known relationship between sensor bias and temperature that was determined in the calibration. The calibration can be a higher order curve that describes a mathematical relationship between the sensor bias and the temperature of the sensor. In the third mode of operation, a correction can be made while the sensor is operating within the predetermined temperature operating range, for example, at point 511. In the third mode of operation, a correction can also be made while the sensor is transitioning from a starting temperature to a temperature within the predetermined temperature operating range, for example, at point 512.

In some embodiments, a sensor chip may comprise a sensor unit; one or more temperature sensors that sense a temperature of at least a portion of the sensor unit; and one or more processors configured to receive a temperature measurement from the one or more temperature sensors. The sensor chip can be in electrical communication with a power source that can provide power to the sensor, the one or more processors, and/or the one or more temperature adjusting devices. In some instances, the one or more processors may be further configured to control a temperature of the sensor unit based on the temperature measurement. In some instances, the one or more processors may be further configured to determine a temperature bias of the sensor unit at (i) an initial temperature (ii) a predetermined temperature and (iii) one or more intermediate temperatures between the initial temperature and the predetermined temperature prior to operation of the sensor. In some instances, the one or more processors may be further configured to correct a sensor measurement from the sensor unit from a starting temperature to an operating temperature based on the determined sensor bias at (1) one or more intermediate temperature between the starting temperature and the predetermined temperature and (2) the predetermined temperature.

In some embodiments, the thermal stimulus for changing a temperature of the sensor unit may be provided from one or more temperature adjusting devices installed in the sensor chip. The one or more temperature adjusting devices may be in thermal communication with the sensor unit to adjust the temperature of the sensor unit through the series of predetermined discrete temperature values, according to an instruction from the one or more processors. Alternatively, the heat for changing a temperature of the sensor unit may be provided from one or more other electronic components adjacent to the sensor chip. For instance, the sensor unit of the sensor chip may be heated by one or more other chips disposed adjacent to the sensor chip. Optionally, the heat for changing a temperature of the sensor unit may be generated by the sensor unit itself. For instance, the sensor unit may generate heat by an internal resistance while it is in operation.

Figure 6:
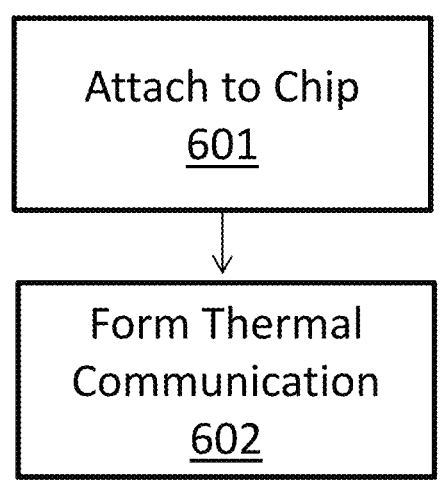
FIG. 6 shows a flow diagram of a manufacturing process.

The sensor and one or more of the temperature adjusting devices can be manufactured on a chip. FIG. 6 shows a process flow diagram describing steps of a process of manufacturing a self-regulating sensor unit on a sensor chip. In a first step of the manufacturing method 601, one or more temperature adjusting devices and the sensor unit can be attached on a shared sensor chip. In a second step 602, thermal communication can be provided between the one or more temperature adjusting devices and the sensor unit. In some cases, these steps can be performed in a reverse order. Additional steps can be included in the manufacturing process.

In some cases, the sensor can be installed onboard a movable object. One or more sensors can be on-board a movable object. One or more sensors can be inside of a housing of a movable object. The housing may enclose one or more sensors. The housing may enclose one or more temperature adjusting devices. The sensor and/or temperature adjusting devices may be outside the housing. The sensor and/or temperature adjusting devices may be part of the housing or embedded within the housing. The sensor and/or temperature adjusting devices may or may not be partially or completely protected from the ambient environment. The sensor and/or temperature adjusting devices may be protected from wind, rain, dust, or other environmental conditions. The sensor and/or temperature adjusting devices may or may not be somewhat thermally insulated from environmental temperatures. For example, thermal insulation may be provided in the housing which may reduce the effects of environmental temperatures on the sensor and/or temperature adjusting devices. The thermal insulation may reduce the effects of environmental temperature by at least 1%, 5%, 10%, 15%, 20%, 25%, 30%, 35%, 40%, 45%, 50%, 55%, 60%, 65%, 70%, 75%, 80%, 85%, 90%, or 95%. The thermal insulation may include any material, including but not limited to foam, plastic, cork, vacuum sealed spaces, fluids, fibrous materials, or any other materials. Alternatively, little or no thermal insulation may be provided. The sensor may directly feel the effects of the environmental temperature. For instance, if the environmental temperature is reduced from 70 degrees to 50 degrees, the sensor may be exposed to the same temperatures.

One or more sensors can be included in a control system of a movable object, or may provide data to the control system. The movable object can move through a variety of environments with different temperatures such that maintaining the sensor within a predetermined range of operating temperatures and/or compensating the sensor bias with an accurate calibration relationship can be important. For instance, the movable object may move from a sunny area to a shady area or vice versa, which may cause a rapid change in environmental temperature. In another example, the movable object may change altitude rapidly, which may result in a change in environmental temperature. The movable object may experience different levels of wind that may result in changes in environmental temperature. The movable object itself may use more or less energy which may cause different amounts of heat to be generated by the movable object itself during normal operation. The temperature adjusting devices may react to adjust or maintain the temperature of the sensor accordingly, or corrections to the sensor bias may be calculated and used in reading the sensor data.

The systems, devices, and methods described herein can be applied to sensors onboard a wide variety of movable objects. A movable object can be an unmanned aerial vehicle (UAV). Any description herein of an aerial vehicle, such as a UAV, may apply to and be used for any movable object. Any description herein of an aerial vehicle may apply specifically to UAVs. A movable object of the present disclosure can be configured to move within any suitable environment, such as in air (e.g., a fixed-wing aircraft, a rotary-wing aircraft, or an aircraft having neither fixed wings nor rotary wings), in water (e.g., a ship or a submarine), on ground (e.g., a motor vehicle, such as a car, truck, bus, van, motorcycle, bicycle; a movable structure or frame such as a stick, fishing pole; or a train), under the ground (e.g., a subway), in space (e.g., a spaceplane, a satellite, or a probe), or any combination of these environments. The movable object can be a vehicle, such as a vehicle described elsewhere herein. In some embodiments, the movable object can be carried by a living subject, or take off from a living subject, such as a human or an animal. Suitable animals can include avines, canines, felines, equines, bovines, ovines, porcines, delphines, rodents, or insects.

The movable object may be capable of moving freely within the environment with respect to six degrees of freedom (e.g., three degrees of freedom in translation and three degrees of freedom in rotation). Alternatively, the movement of the movable object can be constrained with respect to one or more degrees of freedom, such as by a predetermined path, track, or orientation. The movement can be actuated by any suitable actuation mechanism, such as an engine or a motor. The actuation mechanism of the movable object can be powered by any suitable energy source, such as electrical energy, magnetic energy, solar energy, wind energy, gravitational energy, chemical energy, nuclear energy, or any suitable combination thereof. The movable object may be self-propelled via a propulsion system, as described elsewhere herein. The propulsion system may optionally run on an energy source, such as electrical energy, magnetic energy, solar energy, wind energy, gravitational energy, chemical energy, nuclear energy, or any suitable combination thereof. Alternatively, the movable object may be carried by a living being.

In some instances, the movable object can be an aerial vehicle. For example, aerial vehicles may be fixed-wing aircraft (e.g., airplane, gliders), rotary-wing aircraft (e.g., helicopters, rotorcraft), aircraft having both fixed wings and rotary wings, or aircraft having neither (e.g., blimps, hot air balloons). An aerial vehicle can be self-propelled, such as self-propelled through the air. A self-propelled aerial vehicle can utilize a propulsion system, such as a propulsion system including one or more engines, motors, wheels, axles, magnets, rotors, propellers, blades, nozzles, or any suitable combination thereof. In some instances, the propulsion system can be used to enable the movable object to take off from a surface, land on a surface, maintain its current position and/or orientation (e.g., hover), change orientation, and/or change position.

The movable object can be controlled remotely by a user or controlled locally by an occupant within or on the movable object. The movable object may be controlled remotely via an occupant within a separate vehicle. In some embodiments, the movable object is an unmanned movable object, such as a UAV. An unmanned movable object, such as a UAV, may not have an occupant onboard the movable object. The movable object can be controlled by a human or an autonomous control system (e.g., a computer control system), or any suitable combination thereof. The movable object can be an autonomous or semi-autonomous robot, such as a robot configured with an artificial intelligence.

The movable object can have any suitable size and/or dimensions. In some embodiments, the movable object may be of a size and/or dimensions to have a human occupant within or on the vehicle. Alternatively, the movable object may be of size and/or dimensions smaller than that capable of having a human occupant within or on the vehicle. The movable object may be of a size and/or dimensions suitable for being lifted or carried by a human. Alternatively, the movable object may be larger than a size and/or dimensions suitable for being lifted or carried by a human. In some instances, the movable object may have a maximum dimension (e.g., length, width, height, diameter, diagonal) of less than or equal to about: 2 cm, 5 cm, 10 cm, 50 cm, 1 m, 2 m, 5 m, or 10 m. The maximum dimension may be greater than or equal to about: 2 cm, 5 cm, 10 cm, 50 cm, 1 m, 2 m, 5 m, or 10 m. For example, the distance between shafts of opposite rotors of the movable object may be less than or equal to about: 2 cm, 5 cm, 10 cm, 50 cm, 1 m, 2 m, 5 m, or 10 m. Alternatively, the distance between shafts of opposite rotors may be greater than or equal to about: 2 cm, 5 cm, 10 cm, 50 cm, 1 m, 2 m, 5 m, or 10 m.

In some embodiments, the movable object may have a volume of less than 100 cm×100 cm×100 cm, less than 50 cm×50 cm×30 cm, or less than 5 cm×5 cm×3 cm. The total volume of the movable object may be less than or equal to about: 1 cm3, 2 cm3, 5 cm3, 10 cm3, 20 cm3, 30 cm3, 40 cm3, 50 cm3, 60 cm3, 70 cm3, 80 cm3, 90 cm3, 100 cm3, 150 cm3, 200 cm3, 300 cm3, 500 cm3, 750 cm3, 1000 cm3, 5000 cm3, 10,000 cm3, 100,000 cm33, 1 m3, or 10 m3. Conversely, the total volume of the movable object may be greater than or equal to about: 1 cm3, 2 cm3, 5 cm3, 10 cm3, 20 cm3, 30 cm3, 40 cm3, 50 cm3, 60 cm3, 70 cm3, 80 cm3, 90 cm3, 100 cm3, 150 cm3, 200 cm3, 300 cm3, 500 cm3, 750 cm3, 1000 cm3, 5000 cm3, 10,000 cm3, 100,000 cm3, 1 m3, or 10 m3.

In some embodiments, the movable object may have a footprint (which may refer to the lateral cross-sectional area encompassed by the movable object) less than or equal to about: 32,000 cm2, 20,000 cm2, 10,000 cm2, 1,000 cm2, 500 cm2, 100 cm2, 50 cm2, 10 cm2, or 5 cm2. Conversely, the footprint may be greater than or equal to about: 32,000 cm2, 20,000 cm2, 10,000 cm2, 1,000 cm2, 500 cm2, 100 cm2, 50 cm2, 10 cm2, or 5 cm2.

In some instances, the movable object may weigh no more than 1000 kg. The weight of the movable object may be less than or equal to about: 1000 kg, 750 kg, 500 kg, 200 kg, 150 kg, 100 kg, 80 kg, 70 kg, 60 kg, 50 kg, 45 kg, 40 kg, 35 kg, 30 kg, 25 kg, 20 kg, 15 kg, 12 kg, 10 kg, 9 kg, 8 kg, 7 kg, 6 kg, 5 kg, 4 kg, 3 kg, 2 kg, 1 kg, 0.5 kg, 0.1 kg, 0.05 kg, or 0.01 kg. Conversely, the weight may be greater than or equal to about: 1000 kg, 750 kg, 500 kg, 200 kg, 150 kg, 100 kg, 80 kg, 70 kg, 60 kg, 50 kg, 45 kg, 40 kg, 35 kg, 30 kg, 25 kg, 20 kg, 15 kg, 12 kg, 10 kg, 9 kg, 8 kg, 7 kg, 6 kg, 5 kg, 4 kg, 3 kg, 2 kg, 1 kg, 0.5 kg, 0.1 kg, 0.05 kg, or 0.01 kg.

In some embodiments, a movable object may be small relative to a load carried by the movable object. The load may include a payload and/or a carrier, as described in further detail elsewhere herein. In some examples, a ratio of a movable object weight to a load weight may be greater than, less than, or equal to about 1:1. In some instances, a ratio of a movable object weight to a load weight may be greater than, less than, or equal to about 1:1. Optionally, a ratio of a carrier weight to a load weight may be greater than, less than, or equal to about 1:1. When desired, the ratio of an movable object weight to a load weight may be less than or equal to: 1:2, 1:3, 1:4, 1:5, 1:10, or even less. Conversely, the ratio of a movable object weight to a load weight can also be greater than or equal to: 2:1, 3:1, 4:1, 5:1, 10:1, or even greater.

In some embodiments, the movable object may have low energy consumption. For example, the movable object may use less than about: 5 W/h, 4 W/h, 3 W/h, 2 W/h, 1 W/h, or less. In some instances, a carrier of the movable object may have low energy consumption. For example, the carrier may use less than about: 5 W/h, 4 W/h, 3 W/h, 2 W/h, 1 W/h, or less. Optionally, a payload of the movable object may have low energy consumption, such as less than about: 5 W/h, 4 W/h, 3 W/h, 2 W/h, 1 W/h, or less.

Figure 7:
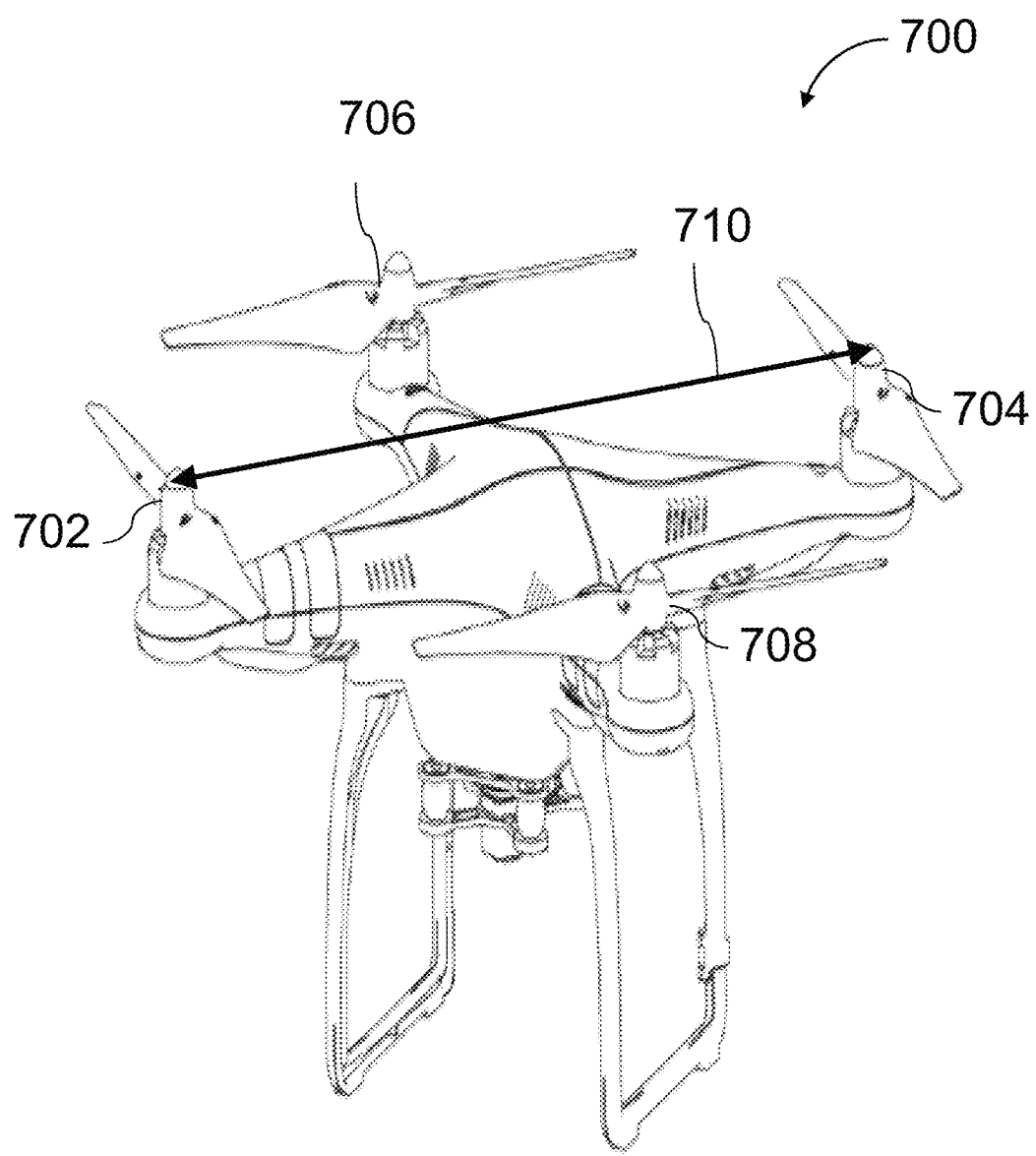
FIG. 7 illustrates an unmanned aerial vehicle, in accordance with an embodiment of the disclosure.

FIG. 7 illustrates an unmanned aerial vehicle (UAV) 700, in accordance with embodiments of the present disclosure. The UAV may be an example of a movable object as described herein. The UAV 700 can include a propulsion system having four rotors 702, 704, 706, and 708. Any number of rotors may be provided (e.g., one, two, three, four, five, six, or more). The rotors, rotor assemblies, or other propulsion systems of the unmanned aerial vehicle may enable the unmanned aerial vehicle to hover/maintain position, change orientation, and/or change location. The distance between shafts of opposite rotors can be any suitable length 710. For example, the length 710 can be less than or equal to 2 m, or less than equal to 5 m. In some embodiments, the length 710 can be within a range from 40 cm to 1 m, from 10 cm to 2 m, or from 5 cm to 5 m. Any description herein of a UAV may apply to a movable object, such as a movable object of a different type, and vice versa. The UAV may use an assisted takeoff system or method as described herein.

In some embodiments, the movable object can be configured to carry a load. The load can include one or more of passengers, cargo, equipment, instruments, and the like. The load can be provided within a housing. The housing may be separate from a housing of the movable object, or be part of a housing for a movable object. Alternatively, the load can be provided with a housing while the movable object does not have a housing. Alternatively, portions of the load or the entire load can be provided without a housing. The load can be rigidly fixed relative to the movable object. Optionally, the load can be movable relative to the movable object (e.g., translatable or rotatable relative to the movable object). The load can include a payload and/or a carrier, as described elsewhere herein.

In some embodiments, the movement of the movable object, carrier, and payload relative to a fixed reference frame (e.g., the surrounding environment) and/or to each other, can be controlled by a terminal. The terminal can be a remote control device at a location distant from the movable object, carrier, and/or payload. The terminal can be disposed on or affixed to a support platform. Alternatively, the terminal can be a handheld or wearable device. For example, the terminal can include a smartphone, tablet, laptop, computer, glasses, gloves, helmet, microphone, or suitable combinations thereof. The terminal can include a user interface, such as a keyboard, mouse, joystick, touchscreen, or display. Any suitable user input can be used to interact with the terminal, such as manually entered commands, voice control, gesture control, or position control (e.g., via a movement, location or tilt of the terminal).

The terminal can be used to control any suitable state of the movable object, carrier, and/or payload. For example, the terminal can be used to control the position and/or orientation of the movable object, carrier, and/or payload relative to a fixed reference from and/or to each other. In some embodiments, the terminal can be used to control individual elements of the movable object, carrier, and/or payload, such as the actuation assembly of the carrier, a sensor of the payload, or an emitter of the payload. The terminal can include a wireless communication device adapted to communicate with one or more of the movable object, carrier, or payload.

The terminal can include a suitable display unit for viewing information of the movable object, carrier, and/or payload. For example, the terminal can be configured to display information of the movable object, carrier, and/or payload with respect to position, translational velocity, translational acceleration, orientation, angular velocity, angular acceleration, or any suitable combinations thereof. In some embodiments, the terminal can display information provided by the payload, such as data provided by a functional payload (e.g., images recorded by a camera or other image capturing device).

Optionally, the same terminal may both control the movable object, carrier, and/or payload, or a state of the movable object, carrier and/or payload, as well as receive and/or display information from the movable object, carrier and/or payload. For example, a terminal may control the positioning of the payload relative to an environment, while displaying image data captured by the payload, or information about the position of the payload. Alternatively, different terminals may be used for different functions. For example, a first terminal may control movement or a state of the movable object, carrier, and/or payload while a second terminal may receive and/or display information from the movable object, carrier, and/or payload. For example, a first terminal may be used to control the positioning of the payload relative to an environment while a second terminal displays image data captured by the payload. Various communication modes may be utilized between a movable object and an integrated terminal that both controls the movable object and receives data, or between the movable object and multiple terminals that both control the movable object and receives data. For example, at least two different communication modes may be formed between the movable object and the terminal that both controls the movable object and receives data from the movable object.

Figure 8:
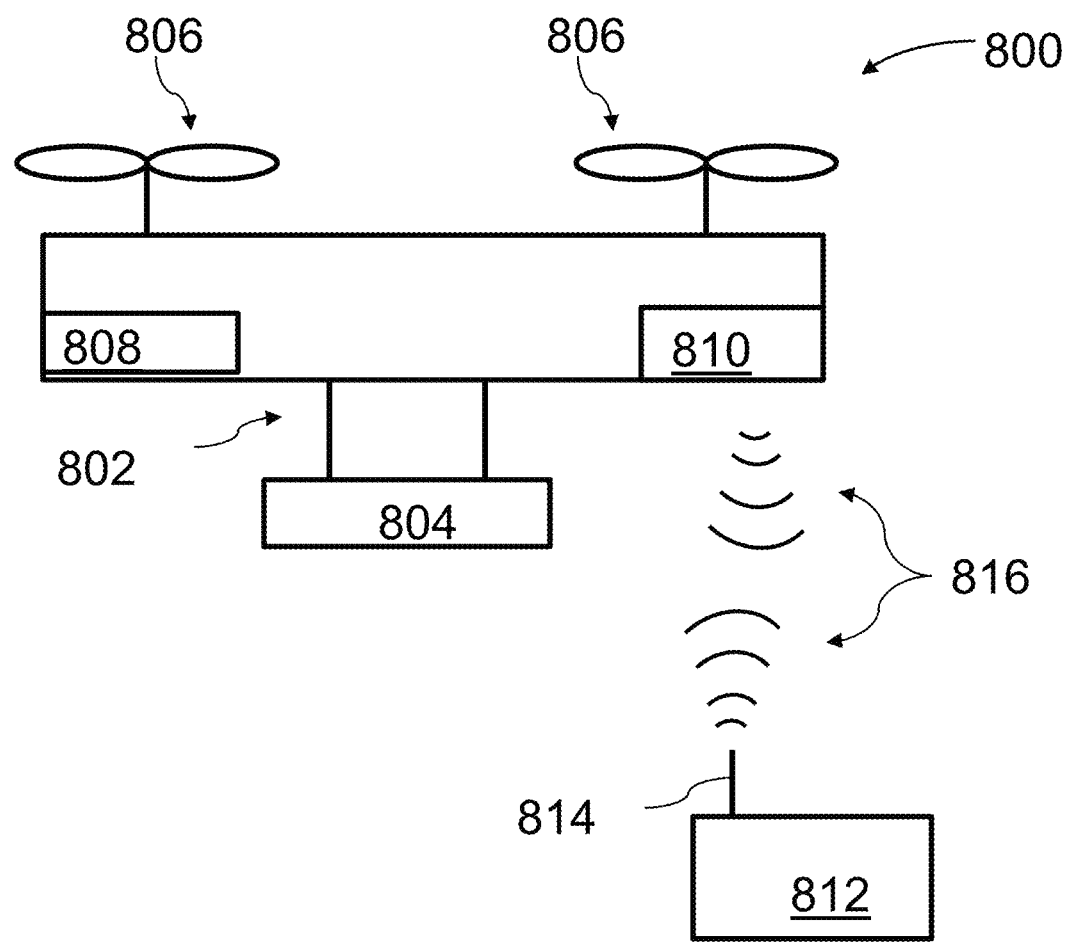
FIG. 8 illustrates a movable object including a carrier and a payload, in accordance with an embodiment of the disclosure.

FIG. 8 illustrates a movable object 800 including a carrier 802 and a payload 804, in accordance with embodiments. Although the movable object 800 is depicted as an aircraft, this depiction is not intended to be limiting, and any suitable type of movable object can be used, as previously described herein. One of skill in the art would appreciate that any of the embodiments described herein in the context of aircraft systems can be applied to any suitable movable object (e.g., an UAV). In some instances, the payload 804 may be provided on the movable object 800 without requiring the carrier 802. The movable object 800 may include propulsion mechanisms 806, a sensing system 808, and a communication system 810.

The propulsion mechanisms 806 can include one or more of rotors, propellers, blades, engines, motors, wheels, axles, magnets, or nozzles, as previously described. The movable object may have one or more, two or more, three or more, or four or more propulsion mechanisms. The propulsion mechanisms may all be of the same type. Alternatively, one or more propulsion mechanisms can be different types of propulsion mechanisms. The propulsion mechanisms 806 can be mounted on the movable object 800 using any suitable means, such as a support element (e.g., a drive shaft) as described elsewhere herein. The propulsion mechanisms 806 can be mounted on any suitable portion of the movable object 800, such on the top, bottom, front, back, sides, or suitable combinations thereof.

In some embodiments, the propulsion mechanisms 806 can enable the movable object 800 to take off vertically from a surface or land vertically on a surface without requiring any horizontal movement of the movable object 800 (e.g., without traveling down a runway). Optionally, the propulsion mechanisms 806 can be operable to permit the movable object 800 to hover in the air at a specified position and/or orientation. One or more of the propulsion mechanisms 800 may be controlled independently of the other propulsion mechanisms. Alternatively, the propulsion mechanisms 800 can be configured to be controlled simultaneously. For example, the movable object 800 can have multiple horizontally oriented rotors that can provide lift and/or thrust to the movable object. The multiple horizontally oriented rotors can be actuated to provide vertical takeoff, vertical landing, and hovering capabilities to the movable object 800. In some embodiments, one or more of the horizontally oriented rotors may spin in a clockwise direction, while one or more of the horizontally rotors may spin in a counterclockwise direction. For example, the number of clockwise rotors may be equal to the number of counterclockwise rotors. The rotation rate of each of the horizontally oriented rotors can be varied independently in order to control the lift and/or thrust produced by each rotor, and thereby adjust the spatial disposition, velocity, and/or acceleration of the movable object 800 (e.g., with respect to up to three degrees of translation and up to three degrees of rotation).

The sensing system 808 can include one or more sensors that may sense the spatial disposition, velocity, and/or acceleration of the movable object 800 (e.g., with respect to up to three degrees of translation and up to three degrees of rotation). The sensors can be combined with built in temperature adjusting devices configured to perform a calibration on the sensor to determine the sensor bias as a function of temperature. In some cases, the temperature adjusting devices can heat or cool the sensor during operation to maintain the temperature of the sensor within a predetermined range of operating temperatures. The one or more sensors can include global positioning system (GPS) sensors, motion sensors, inertial sensors, proximity sensors, or image sensors. The sensing data provided by the sensing system 808 can be used to control the spatial disposition, velocity, and/or orientation of the movable object 800 (e.g., using a suitable processing unit and/or control module, as described below). Alternatively, the sensing system 808 can be used to provide data regarding the environment surrounding the movable object, such as weather conditions, proximity to potential obstacles, location of geographical features, location of manmade structures, and the like.

The communication system 810 enables communication with terminal 812 having a communication system 814 via wireless signals 816. The communication systems 810, 814 may include any number of transmitters, receivers, and/or transceivers suitable for wireless communication. The communication may be one-way communication, such that data can be transmitted in only one direction. For example, one-way communication may involve only the movable object 800 transmitting data to the terminal 812, or vice-versa. The data may be transmitted from one or more transmitters of the communication system 810 to one or more receivers of the communication system 812, or vice-versa. Alternatively, the communication may be two-way communication, such that data can be transmitted in both directions between the movable object 800 and the terminal 812. The two-way communication can involve transmitting data from one or more transmitters of the communication system 810 to one or more receivers of the communication system 814, and vice-versa.

In some embodiments, the terminal 812 can provide control data to one or more of the movable object 800, carrier 802, and payload 804 and receive information from one or more of the movable object 800, carrier 802, and payload 804 (e.g., position and/or motion information of the movable object, carrier or payload; data sensed by the payload such as image data captured by a payload camera). In some instances, control data from the terminal may include instructions for relative positions, movements, actuations, or controls of the movable object, carrier and/or payload. For example, the control data may result in a modification of the location and/or orientation of the movable object (e.g., via control of the propulsion mechanisms 806), or a movement of the payload with respect to the movable object (e.g., via control of the carrier 802). The control data from the terminal may result in control of the payload, such as control of the operation of a camera or other image capturing device (e.g., taking still or moving pictures, zooming in or out, turning on or off, switching imaging modes, change image resolution, changing focus, changing depth of field, changing exposure time, changing viewing angle or field of view). In some instances, the communications from the movable object, carrier and/or payload may include information from one or more sensors (e.g., of the sensing system 808 or of the payload 804). The communications may include sensed information from one or more different types of sensors (e.g., GPS sensors, motion sensors, inertial sensor, proximity sensors, or image sensors). Such information may pertain to the position (e.g., location, orientation), movement, or acceleration of the movable object, carrier and/or payload. Such information from a payload may include data captured by the payload or a sensed state of the payload. The control data provided transmitted by the terminal 812 can be configured to control a state of one or more of the movable object 800, carrier 802, or payload 804. Alternatively or in combination, the carrier 802 and payload 804 can also each include a communication module configured to communicate with terminal 812, such that the terminal can communicate with and control each of the movable object 800, carrier 802, and payload 804 independently.

In some embodiments, the movable object 800 can be configured to communicate with another remote device in addition to the terminal 812, or instead of the terminal 812. The terminal 812 may also be configured to communicate with another remote device as well as the movable object 800. For example, the movable object 800 and/or terminal 812 may communicate with another movable object, or a carrier or payload of another movable object. When desired, the remote device may be a second terminal or other computing device (e.g., computer, laptop, tablet, smartphone, or other mobile device). The remote device can be configured to transmit data to the movable object 800, receive data from the movable object 800, transmit data to the terminal 812, and/or receive data from the terminal 812. Optionally, the remote device can be connected to the Internet or other telecommunications network, such that data received from the movable object 800 and/or terminal 812 can be uploaded to a website or server.

Figure 9:
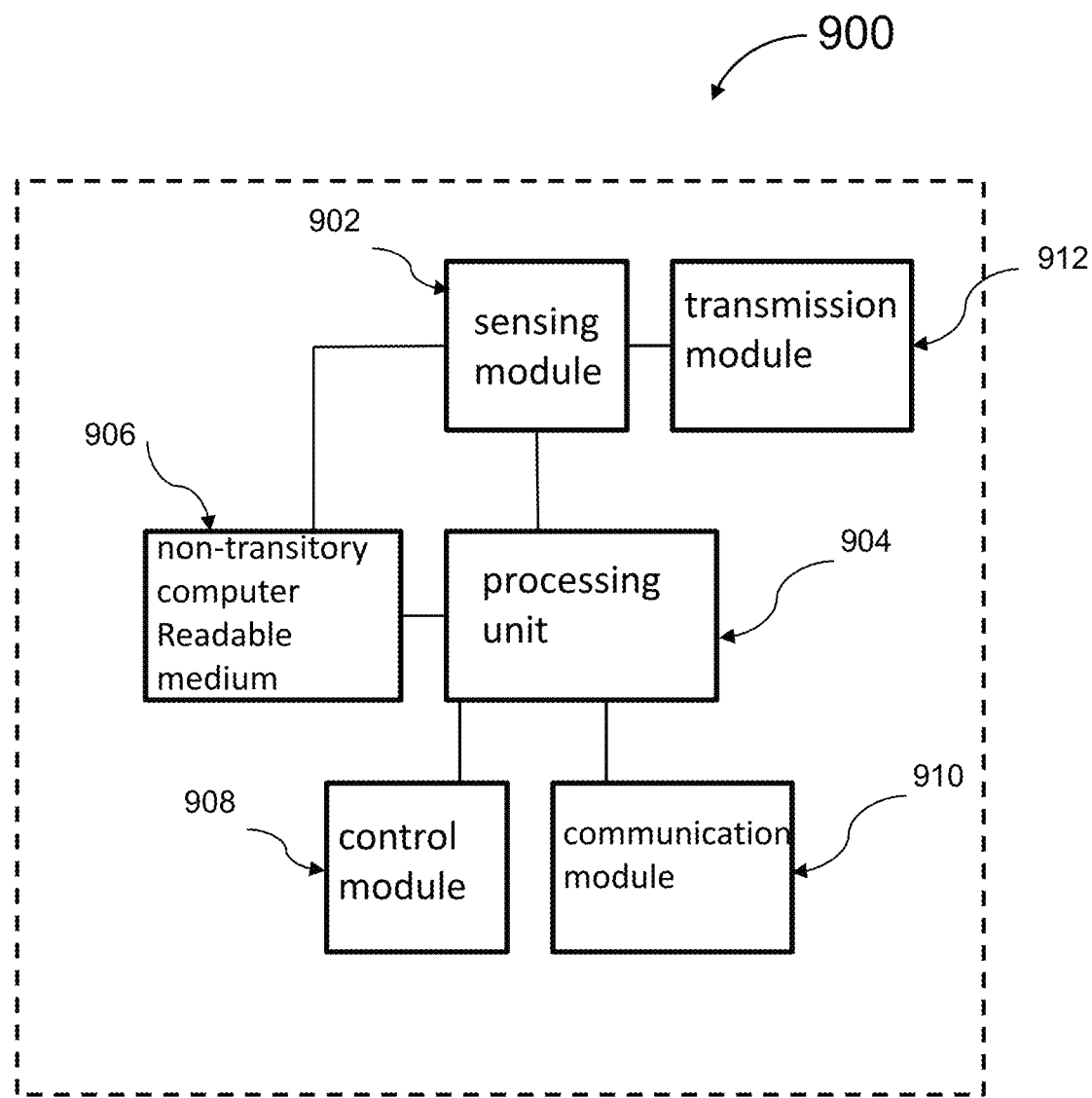
FIG. 9 is a schematic illustration by way of block diagram of a system for controlling a movable object, in accordance with an embodiment of the disclosure.

FIG. 9 is a schematic illustration by way of block diagram of a system 900 for controlling a movable object, in accordance with embodiments. The system 900 can be used in combination with any suitable embodiment of the systems, devices, and methods disclosed herein. The system 900 can include a sensing module 902, processing unit 904, non-transitory computer readable medium 906, control module 908, and communication module 910.

The sensing module 902 can utilize different types of sensors that collect information relating to the movable objects in different ways. Different types of sensors may sense different types of signals or signals from different sources. For example, the sensors can include inertial sensors, GPS sensors, proximity sensors (e.g., lidar), or vision/image sensors (e.g., a camera). The sensing module 902 can be operatively coupled to a processing unit 904 having a plurality of processors. In some embodiments, the sensing module can be operatively coupled to a transmission module 912 (e.g., a Wi-Fi image transmission module) configured to directly transmit sensing data to a suitable external device or system. For example, the transmission module 912 can be used to transmit images captured by a camera of the sensing module 902 to a remote terminal.

The processing unit 904 can have one or more processors, such as a programmable processor (e.g., a central processing unit (CPU)). The processing unit 904 can be operatively coupled to a non-transitory computer readable medium 906. The non-transitory computer readable medium 906 can store logic, code, and/or program instructions executable by the processing unit 904 for performing one or more steps. The non-transitory computer readable medium can include one or more memory units (e.g., removable media or external storage such as an SD card or random access memory (RAM)). In some embodiments, data from the sensing module 902 can be directly conveyed to and stored within the memory units of the non-transitory computer readable medium 906. The memory units of the non-transitory computer readable medium 906 can store logic, code and/or program instructions executable by the processing unit 904 to perform any suitable embodiment of the methods described herein. For example, the processing unit 904 can be configured to execute instructions causing one or more processors of the processing unit 904 to analyze sensing data produced by the sensing module. The memory units can store sensing data from the sensing module to be processed by the processing unit 904. In some embodiments, the memory units of the non-transitory computer readable medium 906 can be used to store the processing results produced by the processing unit 904.

In some embodiments, the processing unit 904 can be operatively coupled to a control module 1608 configured to control a state of the movable object. For example, the control module 1608 can be configured to control the propulsion mechanisms of the movable object to adjust the spatial disposition, velocity, and/or acceleration of the movable object with respect to six degrees of freedom. Alternatively or in combination, the control module 908 can control one or more of a state of a carrier, payload, or sensing module.

The processing unit 904 can be operatively coupled to a communication module 910 configured to transmit and/or receive data from one or more external devices (e.g., a terminal, display device, or other remote controller). Any suitable means of communication can be used, such as wired communication or wireless communication. For example, the communication module 910 can utilize one or more of local area networks (LAN), wide area networks (WAN), infrared, radio, WiFi, point-to-point (P2P) networks, telecommunication networks, cloud communication, and the like. Optionally, relay stations, such as towers, satellites, or mobile stations, can be used. Wireless communications can be proximity dependent or proximity independent. In some embodiments, line-of-sight may or may not be required for communications. The communication module 910 can transmit and/or receive one or more of sensing data from the sensing module 902, processing results produced by the processing unit 904, predetermined control data, user commands from a terminal or remote controller, and the like.

The components of the system 900 can be arranged in any suitable configuration. For example, one or more of the components of the system 900 can be located on the movable object, carrier, payload, terminal, sensing system, or an additional external device in communication with one or more of the above. Additionally, although FIG. 9 depicts a single processing unit 904 and a single non-transitory computer readable medium 906, one of skill in the art would appreciate that this is not intended to be limiting, and that the system 900 can include a plurality of processing units and/or non-transitory computer readable media. In some embodiments, one or more of the plurality of processing units and/or non-transitory computer readable media can be situated at different locations, such as on the movable object, carrier, payload, terminal, sensing module, additional external device in communication with one or more of the above, or suitable combinations thereof, such that any suitable aspect of the processing and/or memory functions performed by the system 900 can occur at one or more of the aforementioned locations.

While some embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the invention and that methods and structures within the scope of these claims and their equivalents be covered thereby.

What is claimed is:

1. A thermal regulation system comprising:
   an inertial measurement unit (IMU);
   one or more temperature adjusting devices that are (1) in thermal communication with the IMU, and (2) configured to adjust a temperature of the IMU from an initial temperature to a predetermined temperature at a rate of temperature change; and
   a filler provided in a space between the IMU and at least one temperature adjusting device of the one or more temperature adjusting devices, and encapsulating the IMU or the at least one temperature adjusting device, the filler being configured to facilitate heat transfer between the IMU and the at least one temperature adjusting device, and the filler being made of a material including silicone;
   wherein a measurement provided by the IMU is adjusted based on a known bias error of the IMU at the predetermined temperature, to reduce error.

2. The system of claim 1, wherein the IMU and the one or more temperature adjusting devices are installed on a shared substrate.

3. The system of claim 1, wherein the IMU and the one or more temperature adjusting devices are installed on a shared chip.

4. The system of claim 1, wherein the one or more temperature adjusting devices include a plurality of temperature adjusting devices uniformly distributed around the IMU in a three-dimensional or a two-dimensional space.

5. The system of claim 1, wherein the filler has a thermal conductivity that is at least two times of a thermal conductivity of air.

6. The system of claim 1, wherein the filler thermally isolates the IMU from debris.

7. The system of claim 1, wherein a bias error of the IMU during a transient state between the initial temperature and the predetermined temperature is corrected based on a known temperature response of the bias error of the IMU.

8. The system of claim 7, wherein the known temperature response of the bias error of the IMU is determined by a user prior to using the IMU.

9. The system of claim 7, wherein the bias error of the IMU is compensated for based on the known temperature response of the bias error during (i) the transient state between the initial temperature and the predetermined temperature and (ii) a constant temperature state in which the IMU is at the predetermined temperature.

10. The system of claim 1, wherein the known bias error of the IMU at the predetermined temperature is determined by a user prior to using the IMU.

11. The system of claim 1, wherein a bias error of the IMU is compensated for based on the known bias error of the IMU at the predetermined temperature.

12. The system of claim 2, wherein the shared substrate includes a printed circuit board (PCB).

13. The system of claim 2, wherein the shared substrate bear a weight of the IMU and the one or more temperature adjusting devices, and the shared substrate includes a metallic board.

14. A method of regulating a temperature of an inertial measurement unit (IMU), the method comprising:
   sensing an initial temperature of the IMU with a temperature sensor;
   providing a thermal stimulus from one or more temperature adjusting devices (1) in thermal communication with the IMU, and (2) configured to adjust a temperature of the IMU from the initial temperature to a predetermined temperature at a rate of temperature change; and
   determining when the initial temperature of the IMU falls outside of a predetermined temperature range;
   wherein:
   a filler is provided in a space between the IMU and at least one temperature adjusting device of the one or more temperature adjusting devices, and encapsulating the IMU or the at least one temperature adjusting device, the filler being configured to facilitate heat transfer between the IMU and the at least one temperature adjusting device, and the filler being made of a material including silicone; and
   a measurement provided by the IMU is adjusted based on a known bias error of the IMU at the predetermined temperature, to reduce error.

15. The method of claim 14, wherein at least one of the one or more temperature adjusting devices is a heater.

16. The method of claim14, wherein at least one of the one or more temperature adjusting devices is a cooling device.

17. The method of claim 14, wherein the filler has a thermal conductivity that is at least two times of a thermal conductivity of air.

18. A method of calibrating a temperature bias of an inertial measurement unit (IMU), the method comprising:
   providing one or more temperature adjusting devices in thermal communication with the IMU;
   traversing through a series of predetermined discrete temperature values comprising a first predetermined discrete temperature value and a second predetermined temperature value, from the first predetermined discrete temperature value to the second predetermined temperature value;

measuring the temperature bias of the IMU at each predetermined discrete temperature value of the series of predetermined discrete temperature values;

determining a relationship between the measured temperature bias of the IMU and each corresponding predetermined discrete temperature value to obtain a known bias error of the IMU at a predetermined temperature; and adjusting a measurement provided by the IMU or another IMU based on the known bias error of the IMU at the predetermined temperature, to reduce error;

wherein a filler is provided in a space between the IMU and at least one temperature adjusting device of the one or more temperature adjusting devices, and encapsulating the IMU or the at least one temperature adjusting device, the filler being configured to facilitate heat transfer between the IMU and the at least one temperature adjusting device, and the filler being made of a material including silicone.

\* \* \* \* \*